US009147636B2

(12) United States Patent
Canegallo et al.

(10) Patent No.: US 9,147,636 B2
(45) Date of Patent: *Sep. 29, 2015

(54) METHOD FOR VERIFYING THE ALIGNMENT BETWEEN INTEGRATED ELECTRONIC DEVICES

(75) Inventors: Roberto Canegallo, Rimini (IT); Mauro Scandiuzzo, Trento (IT); Eleonora Franchi Scarselli, Bologna (IT); Antonio Gnudi, Bologna (IT); Roberto Guerrieri, Bologna (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 989 days.

This patent is subject to a terminal disclaimer.

(21) Appl. No.: 13/295,600

(22) Filed: Nov. 14, 2011

(65) Prior Publication Data

US 2013/0001547 A1 Jan. 3, 2013

Related U.S. Application Data

(63) Continuation of application No. 13/172,711, filed on Jun. 29, 2011, now abandoned.

(51) Int. Cl.
 H01L 23/58 (2006.01)
 H01L 21/66 (2006.01)
 H01L 23/48 (2006.01)
 H01L 25/065 (2006.01)
 H01L 25/00 (2006.01)

(52) U.S. Cl.
 CPC ........... *H01L 23/48* (2013.01); *H01L 22/34* (2013.01); *H01L 25/0657* (2013.01); *H01L 25/50* (2013.01); *H01L 2225/06531* (2013.01); *H01L 2225/06565* (2013.01); *H01L 2225/06593* (2013.01); *H01L 2924/0002* (2013.01)

(58) Field of Classification Search
 CPC .................................. H01L 22/34; H01L 23/48
 See application file for complete search history.

(56) References Cited

U.S. PATENT DOCUMENTS

| 5,483,198 | A | 1/1996 | Nunn |
| 5,737,697 | A | 4/1998 | Yamada |
| 6,518,679 | B2 | 2/2003 | Lu et al. ........................ 257/797 |
| 6,870,271 | B2 | 3/2005 | Sutherland et al. |
| 6,875,640 | B1 | 4/2005 | Farnworth et al. |

(Continued)

OTHER PUBLICATIONS

Canegallo et al., "Electronic Circuit for Communicating Through Capacitive Coupling," U.S. Appl. No. 12/826,565, filed Jun. 29, 2010, 44 pages.

(Continued)

*Primary Examiner* — Jermele M Hollington
(74) *Attorney, Agent, or Firm* — Seed IP Law Group PLLC

(57) ABSTRACT

A method includes communicatively coupling first and second integrated electronic devices together through a plurality of reference capacitors, transmitting a plurality of transmission reference signals on transmission reference electrodes of the plurality of reference capacitors, receiving coupling signals on reception reference electrodes of the plurality of reference capacitors, amplifying said coupling signals, generating a plurality of reception reference signals, generating a plurality of reception control signals as a function of the plurality of reception reference signals, and detecting a possible misalignment between said first and second integrated electronic devices based on the plurality of reception control signals.

34 Claims, 11 Drawing Sheets

(56) References Cited

U.S. PATENT DOCUMENTS

| | | | |
|---|---|---|---|
| 6,916,719 B1 | 7/2005 | Knight et al. | |
| 6,972,596 B1 | 12/2005 | Proebsting et al. | 326/83 |
| 7,067,910 B2 | 6/2006 | Drost et al. | 257/686 |
| 7,200,830 B2 | 4/2007 | Drost et al. | 716/12 |
| 7,456,637 B2 | 11/2008 | Canegallo et al. | 324/662 |
| 8,150,315 B2 * | 4/2012 | Canegallo et al. | 455/41.1 |
| 8,154,307 B2 | 4/2012 | Cathelin et al. | |
| 8,340,576 B2 * | 12/2012 | Canegallo et al. | 455/41.1 |
| 2002/0191835 A1 | 12/2002 | Lu et al. | 382/151 |
| 2005/0075080 A1 | 4/2005 | Zhang | 455/73 |
| 2006/0256964 A1 | 11/2006 | Gu et al. | 380/242 |
| 2007/0067115 A1 | 3/2007 | Canegallo et al. | 702/52 |
| 2007/0092011 A1 | 4/2007 | Ciccarelli et al. | 375/257 |
| 2008/0225987 A1 | 9/2008 | Fazzi et al. | 375/316 |
| 2009/0168860 A1 | 7/2009 | Magagni et al. | 375/226 |
| 2009/0168938 A1 | 7/2009 | Ciccarelli et al. | 375/358 |
| 2011/0319015 A1 * | 12/2011 | Canegallo et al. | 455/41.1 |

OTHER PUBLICATIONS

Canegallo et al., "Method for Verifying the Alignment Between Integrated Electronic Devices," U.S. Appl. No. 12/826,571, filed Jun. 29, 2010, 57 pages.

Canegallo et al., "Method for Verifying the Alignment Between Integrated Electronic Devices," U.S. Appl. No. 13/172,704, filed Jun. 29, 2011, 75 pages.

Franchi et al., "3D Capacitive Transmission of Analog Signals with Automatic Compensation of the Voltage Attenuation," Proceedings of the 1998 IEEE International Symposium on Circuits and Systems, May 31-Jun. 3, 1998, 4 pages.

\* cited by examiner

METHOD FOR VERIFYING THE ALIGNMENT BETWEEN INTEGRATED ELECTRONIC DEVICES

BACKGROUND

1. Technical Field

The present disclosure relates to a method for verifying the alignment between integrated electronic devices.

2. Description of the Related Art

There are available techniques that enable stacking of a number of integrated electronic circuits ("chips"), in such a way as to form a so-called three-dimensional structure, with evident benefits in terms of reduction of the space occupied by the chips; these techniques are commonly known as 3D stacking and are preparatory to the achievement of the so-called 3D packaging, i.e., of the three-dimensional structures.

Within single three-dimensional structures, it is moreover possible to connect the chips contained therein in such a way as to enable exchange of signals between the chips themselves. For this purpose, it is possible to resort to systems of communication between chips, i.e., communications systems that enable communications of a so-called "inter-chip" type, thanks to the presence of a coupling between two or more chips. The coupling can be of a so-called "contact" type, i.e., of an ohmic type, in which case it can be implemented by one or more of the following: through silicon vias (TSVs), bumps, pillar bumps, etc. Alternatively, the coupling can be of a so-called "contactless" type, i.e., for example, of an inductive or capacitive type.

Irrespective of the coupling type, in order to optimize the communications between the chips present in a given three-dimensional structure, it is important for the chips to be properly stacked to form the three-dimensional structure. In fact, a possible misalignment between two or more chips, may not only prevent a correct packaging of the three-dimensional structure, but may also involve a reduction in the possibility of carrying out communications between the chips of the three-dimensional structure, given that the corresponding couplings may be damaged on account of misalignment.

By way of example, FIG. 1 shows a misalignment within a structure formed by a first chip IC1 and a second chip IC2, for example, introduced during the packaging (or stacking) of the first and second chips IC1, IC2. In practice, with respect to the reference system x, y, z shown in FIG. 1, the first chip IC1 is translated with respect to the second chip IC2 by a deviation $\Delta x$ along the axis x of the reference system x, y, z. In addition, whereas the second chip IC2 is correctly aligned to the reference system x, y, z, i.e., it has respective principal axes x'', y'', z'' aligned with the corresponding axes of the reference system x, y, z, the first chip IC1 is rotated by an angle $\phi$ with respect to the reference system x, y, z, and hence is tilted by the angle $\phi$ with respect to the second chip IC2. In particular, the first chip IC1 has respective principal axes x', y', z', and the axes x' and z' are rotated by the angle $\phi$ with respect to the axes x and z, respectively. This rotation contributes to the misalignment between the first chip IC1 and the second chip IC2. In a similar way, the first chip IC1 can likewise be rotated with respect to the second chip IC2 by an angle $\theta$ (not shown), formed by the plane defined by the axes y' and z' and by the plane defined by the axes y'' and z''.

In a way similar to what has been described in regard to the chips, techniques enable stacking of a number of dice, where by "die" is meant the result of the step of "dicing" commonly used in the processes of formation of the die. In practice, it is today possible to obtain three-dimensional structures formed by a number of dice, in a way similar to what was previously possible with chips alone.

Also for the three-dimensional structures formed by dice, the misalignment between two or more dice may entail the impossibility of packaging correctly the three-dimensional structures, in addition to the reduction in the possibility of carrying out communications between the dice, which are uncoupled on account of the misalignment.

In order to detect the presence of a misalignment, techniques are available that envisage the use of markers, which are set on the chips/dice. Appropriate optical detectors determine the positions of the optical markers; subsequently, the positions determined are processed in such a way as to verify the alignment of the chips/dice.

The techniques based upon the use of markers enable verification of the alignment of the chips/dice with high precision; however, they are particularly costly and complex given that they require the use of optical detectors.

Furthermore, different techniques exist, which envisage coupling, by means of appropriate capacitors, the chips, alignment of which is to be verified, and detecting the presence of possible misalignments on the basis of signals transmitted and received on the electrodes of these capacitors, as described, for example, in the U.S. Patent Publication No. US2002/0191835, or else in the U.S. Patent Publication No. US2007/0067115. These techniques are, however, subject to the limits intrinsically associated to determination of the values of capacitance of the capacitors; hence, they do not enable detection of misalignments in a particularly precise way.

BRIEF SUMMARY

An embodiment provides a method for verifying the alignment of integrated electronic devices that will enable the drawbacks of the known art to be at least partially overcome.

According to an embodiment, a method for verifying the alignment of a first integrated electronic device and a second integrated electronic device is provided.

In an embodiment, a method comprises communicatively coupling first and second integrated electronic devices together through a plurality of reference capacitors; transmitting a plurality of transmission reference signals on transmission reference electrodes of the plurality of reference capacitors; receiving coupling signals on reception reference electrodes of the plurality of reference capacitors; amplifying said coupling signals, generating a plurality of reception reference signals; generating a plurality of reception control signals as a function of the plurality of reception reference signals; and detecting a possible misalignment between said first and second integrated electronic devices based on the plurality of reception control signals. In an embodiment, detecting a possible misalignment comprises comparing an expected relation between the plurality of reception control signals to an effective relationship between the plurality of reception control signals. In an embodiment, the method further comprises the step of generating a reception reference voltage, wherein the generating a plurality of reception control signals comprises determining a difference between an amplitude of a respective reception reference signal and the reception reference voltage. In an embodiment, the method further comprises: receiving a calibration signal; amplifying said calibration signal, generating the plurality of transmission reference signals; generating a plurality of transmission control signals as a function of respective transmission reference signals; and controlling levels of amplification of the calibration signal as a function of said transmission control signal. In an embodiment, the method further comprises: generating a transmission reference voltage, wherein the generating a plurality of transmission control signals comprises determining a difference between an amplitude of the respective transmission reference signals and said transmission reference voltage. In an embodiment, said transmission reference voltage and said reception reference voltage have a same voltage level. In an embodiment, said steps of generating a transmission reference voltage and generating a reception reference voltage comprise using voltage generators of a bandgap type. In an embodiment, determining the difference between an amplitude of the respective reception reference signal and the reception reference voltage comprises: generating a first current proportional to the amplitude of the respective reception reference signal; generating a second current proportional to the reception reference voltage; and integrating in time a current difference proportional to the difference of said first and second currents. In an embodiment, the method further comprises: providing said plurality of transmission reference electrodes on the first integrated electronic device; and providing said plurality of reception reference electrodes on said second integrated electronic device. In an embodiment, providing said plurality of transmission reference electrodes comprises forming said plurality of transmission reference electrodes of a first geometrical shape, and providing said plurality of reception reference electrodes comprises forming said plurality of reception reference electrodes of a second geometrical shape. In an embodiment, the first geometric shape and the second geometric shape are a same shape. In an embodiment, said coupling step comprises providing at least one coupling capacitor of a communication channel having a communication transmission electrode and a communication reception electrode set on respective ones of the first and second integrated electronic devices. In an embodiment, the method further comprises transmitting on said communication transmission electrode a communication signal; receiving on said communication reception electrode a corresponding communication reception signal; amplifying said communication reception signal, generating a compensated signal; and controlling a level of amplification of said communication reception signal as a function of one of said plurality of reception control signals. In an embodiment, detecting a possible misalignment is further based on an amplitude of said communication signal and an amplitude of said compensated signal. In an embodiment, detecting a possible misalignment is further based on the calibration signal.

In an embodiment, a system comprises: a plurality of integrated circuits; and a plurality of reference calibration devices integrated into the plurality of integrated circuits, each of the reference calibration devices including: a reference transmission electrode of a reference capacitor on one of the plurality of integrated circuit; a transmitter configured to transmit time-variant communication signals communicatively coupled to the reference transmission electrode; a reception reference electrode of the reference capacitor on another of the plurality of integrated circuit; a reception reference variable-gain amplifier having a first input communicatively coupled to the reception reference electrode of the reference capacitor and configured to generate a calibration reference signal; and a reception reference gain control block coupled to an output of the reception reference variable-gain amplifier and configured to generate at least one gain control signal to control a gain of the reception reference variable-gain amplifier based on the calibration reference signal, wherein respective gain control signals of the plurality of reference calibration devices have one or more expected relationships when the plurality of integrated circuits are aligned. In an embodiment, the system further comprises: an alignment detector configured to receive the gain control signals of the plurality of reference calibration devices and to determine whether a relationship of the gain control signals of the plurality of reference calibration devices is consistent with alignment of the plurality of integrated circuits. In an embodiment, the alignment detector is on one of the plurality of integrated circuits. In an embodiment, the plurality of integrated circuits is two integrated circuits. In an embodiment, the reception gain control block comprises: a bandgap block configured to generate a reception reference voltage; and a comparator configured to determine a difference between an amplitude of the output of the reception reference variable-gain amplifier and the reception reference voltage. In an embodiment, the plurality of reference calibration devices each comprises: a transmission calibration variable-gain amplifier having a calibration signal input configured to receive a calibration signal, a control input configured to receive a gain control signal and an output communicatively coupled to the reference transmission electrode; a comparator block coupled between the output of the transmission calibration variable-gain amplifier and the control input of the transmission calibration variable gain amplifier to form a feed-back loop; and a bandgap block coupled to the comparator block and configured to provide a substantially constant reference voltage. In an embodiment the respective reference transmission electrodes each have a first geometrical shape, and the reception reference electrodes have a second geometrical shape. In an embodiment, the system further comprises a communication channel integrated into the plurality of integrated circuits, the communication channel having: a communication transmission electrode of a communication coupling capacitor on one of the plurality of integrated circuits; a transmitter configured to transmit time-variant communication signals communicatively coupled to the communication transmission electrode; a communication reception electrode of the communication coupling capacitor on another of the plurality of integrated circuit devices; and a communication reception variable-gain amplifier having a first input communicatively coupled to the communication reception electrode of the communication coupling capacitor and configured to generate a communication compensation signal, and a gain control input coupled to one of the gain control signals generated by the plurality of reference calibration devices.

In an embodiment, a device comprises: a first integrated circuit having a plurality of transmission reference electrodes of a corresponding plurality of calibration capacitors, the plurality of transmission reference electrodes configured to transmit respective time-variant communication signals; and a second integrated circuit configured to couple to the first integrated circuit and including: a plurality of reception reference electrodes of the plurality of calibration capacitors; a plurality of calibration amplifiers communicatively coupled to respective reception reference electrodes of the plurality of calibration capacitors and configured to generate a plurality of calibration reference signals; and a plurality of reception reference gain control blocks configured to generate gain control signals to control respective gains of the plurality of calibration amplifiers based on respective outputs of the calibration amplifiers, wherein the generated gain control signals have corresponding expected relationships when the first and second integrated circuits are aligned. In an embodiment, the plurality of transmission reference electrodes include a center transmission reference electrode, and the other electrodes of the plurality of transmission reference electrodes surround the center transmission reference electrode, have a first shape and are each a first distance from the center transmission reference electrode; and the plurality of reception reference electrodes include a center reception reference electrode, and the other electrodes of the plurality of reception reference electrodes surround the center reception reference electrode, have a second shape and are each a second distance from the center reception reference electrode. In an embodiment, the center transmission reference electrode and the center reception reference electrode have a third shape and, when the first and second integrated circuits are aligned, the center transmission reference electrode and the center reception reference electrode are superimposed, and the respective surrounding transmission reference electrodes and surrounding reception reference electrodes of the plurality of calibration capacitors are partially superimposed. In an embodiment, the device further comprises: an alignment detector configured to determine whether the first and second integrated circuits are aligned based on the generated gain control signals.

In an embodiment, a system comprises: a first integrated circuit, including: means for generating a plurality of time-variant reference transmission signals; means for transmitting the plurality of time-variant reference transmission signals; a second integrated circuit configured to couple to the first integrated circuit and including: means for receiving the plurality of transmitted time-variant reference transmission signals; means for generating a plurality of reception reference signals from the received time-variant reference transmission signals; and means for generating a plurality of gain control signals to control the means for generating the plurality of reception reference signals; and means for determining whether the first and second integrated circuits are aligned based on the generated plurality of gain control signals. In an embodiment, the means for determining is on the second integrated circuit.

In an embodiment, a non-transitory computer-readable medium's contents cause at least one electronic device to perform a method, the method comprising: transmitting a plurality of transmission reference signals on transmission reference electrodes of a plurality of reference capacitors coupling first and second integrated circuits together; receiving coupling signals on reception reference electrodes of the plurality of reference capacitors; amplifying said coupling signals, generating a plurality of reception reference signals; generating reception control signals as a function of the plurality of reception reference signals; and detecting a possible misalignment between the first and second integrated circuits based on a plurality of the reception control signals. In an embodiment, the method further comprises: transmitting a first communication signal on a first transmission electrode of a first coupling capacitor; receiving a first reception signal on a first reception electrode of said first coupling capacitor; amplifying said first reception signal, generating a first compensated signal; and controlling a level of amplification of amplifying said first reception signal as a function of one of the reception control signals. In an embodiment, the method further comprises: generating at least one reception reference voltage, and wherein generating the plurality of reception control signals comprises determining a difference between an amplitude of at least one of the reception reference signals and said at least one reception reference voltage. In an embodiment, the method further comprises: receiving a calibration signal; amplifying said calibration signal, generating the transmission reference signals; generating transmission control signals as a function of said transmission reference signals; and controlling one or more levels of amplification of the calibration signal as a function of said transmission control signals. In an embodiment, the method further comprises: generating a transmission reference voltage, wherein said step of generating transmission control signals comprises determining a difference between an amplitude of at least one of said transmission reference signals and said transmission reference voltage.

In an embodiment, a method for verifying the alignment between a first integrated electronic device and a second integrated electronic device comprises the steps of: coupling said first and second integrated electronic devices by means of a reference capacitor and a first coupling capacitor; transmitting a transmission reference signal on a transmission reference electrode of said reference capacitor; receiving a coupling signal on a reception reference electrode of said reference capacitor; amplifying said coupling signal, generating a reception reference signal; generating a reception control signal as a function of said reception reference signal; transmitting a first communication signal on a first transmission electrode of said first coupling capacitor; receiving a first reception signal on a first reception electrode of said first coupling capacitor; amplifying said first reception signal, generating a first compensated signal; controlling a level of amplification in said steps of amplifying said coupling signal and of amplifying said first reception signal as a function of said reception control signal; and comparing an amplitude of said first communication signal and an amplitude of said first compensated signal, and detecting the presence of a possible misalignment between said first and second integrated electronic devices on the basis of the result of the step of comparing. In an embodiment, the method further comprises the steps of: establishing an expected relation between said first communication signal and said first compensated signal; and determining an effective relation between the amplitude of said first communication signal and the amplitude of said first compensated signal; and wherein said step of comparing comprises comparing said effective relation and said expected relation. In an embodiment, the method further comprises the step of generating a reception reference voltage, and wherein said step of generating a reception control signal comprises determining a difference between an amplitude of said reception reference signal and said reception reference voltage. In an embodiment, the method further comprises the steps of: receiving a calibration signal; amplifying said calibration signal, generating a transmission reference signal; generating a transmission control signal as a function of said transmission reference signal; and controlling a level of amplification in said step of amplifying said calibration signal as a function of said transmission control signal. In an embodiment, the method further comprises the step of generating a transmission reference voltage, wherein said step of generating a transmission control signal comprises determining a difference between an amplitude of said transmission reference signal and said transmission reference voltage. In an embodiment, said transmission reference voltage and said reception reference voltage are the same as one another. In an embodiment, said steps of generating a transmission reference voltage and a reception reference voltage comprise using voltage generators of a bandgap type. In an embodiment, wherein said step of determining a difference between an amplitude of said reception reference signal and said reception reference voltage comprises: generating a first current proportional to the amplitude of said reception reference signal; generating a second current proportional to said reception reference voltage; and integrating in time a current difference proportional to the difference of said first and second currents. In an embodiment, the method further comprises the step of providing said transmission reference electrode and said first transmission electrode on said first integrated electronic device, and the step of providing said reception reference electrode and said first reception electrode on said second integrated electronic device. In an embodiment, said step of providing said transmission reference electrode and said first transmission electrode comprises forming said transmission reference electrode and said first transmission electrode in such a way that they have one and the same first geometrical shape, and wherein said step of providing said reception reference electrode and said first reception electrode comprises forming said reception reference electrode and said first reception electrode in such a way that they have one and the same second geometrical shape. In an embodiment, wherein said coupling step comprises providing at least one second coupling capacitor having a second transmission electrode and a second reception electrode, set, respectively, on said first and second integrated electronic devices. In an embodiment, the method further comprises the steps of: transmitting on said second transmission electrode a second communication signal; receiving on said second reception electrode a corresponding second reception signal; amplifying said second reception signal, generating a second compensated signal; controlling a level of amplification in said step of amplifying said second reception signal as a function of said reception control signal; and comparing an amplitude of said second communication signal with an amplitude of said second compensated signal, said step of detecting the presence of a possible misalignment being moreover a function of said step of comparing an amplitude of said second communication signal with an amplitude of said second compensated signal. In an embodiment, said coupling step further comprises providing a third coupling capacitor and a fourth coupling capacitor, said third coupling capacitor having a third transmission electrode and a third reception electrode, set, respectively, on said first integrated electronic device and said second integrated electronic device, said fourth coupling capacitor having a fourth transmission electrode and a fourth reception electrode, set, respectively, on said first and second integrated electronic devices; and wherein said first, second, third, and fourth transmission electrodes surround said transmission reference electrode, are at the same distance from said transmission reference electrode, and have one and the same third geometrical shape; and wherein said first, second, third, and fourth reception electrodes surround said reception reference electrode, are at the same distance from said reception reference electrode, and have one and the same fourth geometrical shape. In an embodiment, wherein said transmission reference electrode and said reception reference electrode have one and the same fifth geometrical shape and are set in such a way that, when said first and second integrated electronic devices are aligned, they are completely superimposed; and wherein said first, second, third, and fourth transmission electrodes and said first, second, third, and fourth reception electrodes are set in such a way that, when said first and second integrated electronic devices are aligned, said first, second, third, and fourth transmission electrodes are partially superimposed, respectively, on said first, second, third, and fourth reception electrodes. In an embodiment, the method further comprises the steps of: transmitting on said second, third, and fourth transmission electrodes, respectively, a second communication signal, a third communication signal, and a fourth communication signal; receiving on said second, third, and fourth reception electrodes, respectively, a second reception signal, a third reception signal, and a fourth reception signal; amplifying said second, third, and fourth reception signals, generating, respectively, a second compensated signal, a third compensated signal, and a fourth compensated signal; controlling levels of amplification in said steps of amplifying said second, third, and fourth reception signal as a function of said reception control signal; and comparing the amplitudes of said second, third, and fourth compensated signals, respectively, with the amplitudes of the second, third, and fourth communication signals, said step of detecting the presence of a possible misalignment being moreover a function of said step of comparing the amplitudes of said second, third, and fourth compensated signals.

In an embodiment, a method, comprises: communicatively coupling first and second integrated electronic devices together through a reference capacitor and a first coupling capacitor; transmitting a transmission reference signal on a transmission reference electrode of said reference capacitor; receiving a coupling signal on a reception reference electrode of said reference capacitor; amplifying said coupling signal, generating a reception reference signal; generating a reception control signal as a function of said reception reference signal; transmitting a first communication signal on a first transmission electrode of said first coupling capacitor; receiving a first reception signal on a first reception electrode of said first coupling capacitor; amplifying said first reception signal, generating a first compensated signal; controlling a level of amplification in said steps of amplifying said coupling signal and of amplifying said first reception signal as a function of said reception control signal; and detecting a possible misalignment between said first and second integrated electronic devices based on an amplitude of said first communication signal and an amplitude of said first compensated signal. In an embodiment, the method further comprises the steps of: establishing an expected relation between said first communication signal and said first compensated signal; and determining an effective relation between the amplitude of said first communication signal and the amplitude of said first compensated signal, wherein said step of detecting comprises comparing said effective relation and said expected relation. In an embodiment, the method further comprises the step of generating a reception reference voltage, wherein said step of generating a reception control signal comprises determining a difference between an amplitude of said reception reference signal and said reception reference voltage. In an embodiment, the method further comprises the steps of: receiving a calibration signal; amplifying said calibration signal, generating the transmission reference signal; generating a transmission control signal as a function of said transmission reference signal; and controlling a level of amplification in said step of amplifying said calibration signal as a function of said transmission control signal. In an embodiment, the method further comprises: generating a transmission reference voltage, wherein said step of generating a transmission control signal comprises determining a difference between an amplitude of said transmission reference signal and said transmission reference voltage. In an embodiment, said transmission reference voltage and said reception reference voltage have a same voltage level. In an embodiment, said steps of generating a transmission reference voltage and generating a reception reference voltage comprise using voltage generators of a bandgap type. In an embodiment, said step of determining a difference between an amplitude of said reception reference signal and said reception reference voltage comprises: generating a first current proportional to the amplitude of said reception reference signal; generating a second current proportional to said reception reference voltage; and integrating in time a current difference proportional to the difference of said first and second currents. In an embodiment, the method further comprises: providing said transmission reference electrode and said first transmission electrode on said first integrated electronic device; and providing said reception reference electrode and said first reception electrode on said second integrated electronic device. In an embodiment, said step of providing said transmission reference electrode and said first transmission electrode comprises forming said transmission reference electrode and said first transmission electrode of a first geometrical shape, and wherein said step of providing said reception reference electrode and said first reception electrode comprises forming said reception reference electrode and said first reception electrode of a second geometrical shape. In an embodiment, said coupling step comprises providing at least one second coupling capacitor having a second transmission electrode and a second reception electrode, set, respectively, on said first and second integrated electronic devices. In an embodiment, the method further comprises the steps of: transmitting on said second transmission electrode a second communication signal; receiving on said second reception electrode a corresponding second reception signal; amplifying said second reception signal, generating a second compensated signal; and controlling a level of amplification in said step of amplifying said second reception signal as a function of said reception control signal wherein said step of detecting a possible misalignment is based on an amplitude of said second communication signal and an amplitude of said second compensated signal. In an embodiment, said coupling step further comprises providing a third coupling capacitor and a fourth coupling capacitor, said third coupling capacitor having a third transmission electrode and a third reception electrode, set, respectively, on said first integrated electronic device and said second integrated electronic device, said fourth coupling capacitor having a fourth transmission electrode and a fourth reception electrode, set, respectively, on said first and second integrated electronic devices; and wherein said first, second, third, and fourth transmission electrodes surround said transmission reference electrode, are at a same distance from said transmission reference electrode, and have a first geometrical shape; and wherein said first, second, third, and fourth reception electrodes surround said reception reference electrode, are at a same distance from said reception reference electrode, and have a second geometrical shape. In an embodiment, said transmission reference electrode and said reception reference electrode have a third geometrical shape and are set in such a way that, when said first and second integrated electronic devices are aligned, they are completely superimposed; and wherein said first, second, third, and fourth transmission electrodes and said first, second, third, and fourth reception electrodes are set in such a way that, when said first and second integrated electronic devices are aligned, said first, second, third, and fourth transmission electrodes are partially superimposed, respectively, on said first, second, third, and fourth reception electrodes. In an embodiment, the method further comprises: transmitting on said second, third, and fourth transmission electrodes, respectively, a second communication signal, a third communication signal, and a fourth communication signal; receiving on said second, third, and fourth reception electrodes, respectively, a second reception signal, a third reception signal, and a fourth reception signal; amplifying said second, third, and fourth reception signals, generating, respectively, a second compensated signal, a third compensated signal, and a fourth compensated signal; and controlling levels of amplification in said steps of amplifying said second, third, and fourth reception signal as a function of said reception control signal, wherein the detecting is based on amplitudes of the second, third and fourth compensated signals and amplitudes of the second, third and fourth communication signals. In an embodiment, the detecting comprises comparing the amplitudes of said first, second, third, and fourth compensated signals, respectively, with the amplitudes of the first, second, third, and fourth communication signals.

In an embodiment, a device comprises: a first integrated circuit, including: a transmission electrode of a first coupling capacitor; a first transmitter to transmit a time-variant first communication signal communicatively coupled to the transmission electrode of the first coupling capacitor; a reference transmission electrode of a reference capacitor, configured to transmit a time-variant transmission reference signal; and a second integrated circuit configured to couple to the first integrated circuit and including: a reception electrode of the first coupling capacitor; a first coupling variable-gain amplifier having a first input communicatively coupled to the reception electrode of the first coupling capacitor and configured to generate a first compensated signal; a reception electrode of the reference capacitor; a reference variable-gain amplifier having a first input communicatively coupled to the reception electrode of the reference capacitor; and a reception gain control block coupled to an output of the reference variable-gain amplifier and configured to generate at least one gain control signal to control a gain of the first coupling variable-gain amplifier and a gain of the reference variable-gain amplifier based on the output of the reference variable-gain amplifier, wherein an amplitude of the first communication signal and an amplitude of the first compensated signal have an expected relationship when the first and second integrated circuits are aligned. In an embodiment, the device further comprises: an alignment detector configured to couple to the first transmitter and the output of the first coupling variable-gain amplifier and to determine whether a relationship of the amplitude of the first communication signal and the amplitude of the first compensated signal is consistent with alignment of the first and second integrated circuits. In an embodiment, the alignment detector is on the first integrated circuit. In an embodiment, the reception gain control block comprises: a bandgap block configured to generate a reception reference voltage; and a comparator configured to determine a difference between an amplitude of the output of the second variable-gain amplifier and the reception reference voltage. In an embodiment, the first integrated circuit comprises: a transmission calibration variable-gain amplifier having a calibration signal input configured to receive a calibration signal, a control input configured to receive a gain control signal and an output communicatively coupled to the reference transmission electrode; a comparator block coupled between the output of the transmission calibration variable-gain amplifier and the control input of the variable gain amplifier to form a feed-back loop; and a bandgap block coupled to the comparator block and configured to provide a substantially constant reference voltage. In an embodiment, the reference transmission electrode and the transmission electrode of the first coupling capacitor have a first geometrical shape, and the reception electrode of the reference capacitor and the reception electrode of the first coupling capacitor have a second geometrical shape. In an embodiment, the device further comprises a second coupling capacitor having a transmission electrode on the first integrated circuit and a reception electrode on the second integrated circuit, the first integrated circuit further comprising a second transmitter configured to transmit a second communication signal and the second integrated circuit further comprising a second coupling variable-gain amplifier configured to generate a second compensated signal, wherein the reception gain control block is configured to control a gain of the second coupling variable-gain amplifier based on the output of the reference variable-gain amplifier, and an amplitude of the second communication signal and an amplitude of the second compensated signal have an expected relationship when the first and second integrated circuits are aligned.

In an embodiment, a device comprises: a first integrated circuit, including: a plurality of transmission electrodes of a corresponding plurality of coupling capacitors, the plurality of transmission electrodes configured to transmit respective time-variant communication signals; and a reference transmission electrode of a reference capacitor, configured to transmit a time-variant transmission reference signal; and a second integrated circuit configured to couple to the first integrated circuit and including: a plurality of reception electrodes of the plurality of coupling capacitors; a plurality of coupling amplifiers communicatively coupled to respective reception electrodes of the plurality of coupling capacitors and configured to generate a plurality of compensated signals; a reference reception electrode of the reference capacitor; a reference amplifier having a first input communicatively coupled to the reference reception electrode of the reference capacitor; and a reception gain control block configured to generate at least one gain control signal to control respective gains of the coupling amplifiers and of the reference amplifier based on an output of the reference amplifier, wherein amplitudes of the respective communication signals and corresponding compensated signals have corresponding expected relationships when the first and second integrated circuits are aligned. In an embodiment, the plurality of transmission electrodes surround the reference transmission electrode, have a first shape and are each a first distance from the reference transmission electrode; and the plurality of reception electrodes surround the reference reception electrode, have a second shape and are each a second distance from said reference reception. In an embodiment, the reference transmission electrode and the reference reception electrode have a third shape and, when the first and second integrated circuits are aligned, the reference transmission electrode and the reference reception electrode are superimposed and the respective transmission electrodes and reception electrodes of the plurality of coupling capacitors and partially superimposed. In an embodiment, the device further comprises: an alignment detector configured to determine whether the first and second integrated circuits are aligned based on the amplitudes of the respective communication signals and corresponding compensated signals.

In an embodiment, a system comprises: a first integrated circuit, including: means for generating a time-variant first communication signal; means for transmitting the time-variant first communication signal; means for generating a time-variant reference transmission signal; means for transmitting the time-variant reference transmission signal; a second integrated circuit configured to couple to the first integrated circuit and including: means for receiving the transmitted time-variant first communication signal; means for generating a first compensated signal from the received first communication signal; means for receiving the transmitted reference transmission signal; means for generating a reception reference signal based on the received reference transmission signal; and means for controlling a gain of the means for generating a first compensated signal and of the means for generating a reception reference signal based on the reception reference signal; and means for determining whether the first and second integrated circuits are aligned based on amplitudes of the first communication signal and of the first compensated signal. In an embodiment, the means for determining is on the first integrated circuit.

In an embodiment, a non-transitory computer-readable medium's contents cause at least one electronic device to perform a method, the method comprising: transmitting a transmission reference signal on a transmission reference electrode of a reference capacitor; receiving a coupling signal on a reception reference electrode of said reference capacitor; amplifying said coupling signal, generating a reception reference signal; generating a reception control signal as a function of said reception reference signal; transmitting a first communication signal on a first transmission electrode of a first coupling capacitor; receiving a first reception signal on a first reception electrode of said first coupling capacitor; amplifying said first reception signal, generating a first compensated signal; controlling a level of amplification of amplifying said coupling signal and of amplifying said first reception signal as a function of said reception control signal; and detecting a possible misalignment between first and second integrated electronic devices based on an amplitude of said first communication signal and an amplitude of said first compensated signal. In an embodiment, the method further comprises: establishing an expected relation between said first communication signal and said first compensated signal; and determining an effective relation between the amplitude of said first communication signal and the amplitude of said first compensated signal, wherein said step of detecting comprises comparing said effective relation and said expected relation. In an embodiment, the method further comprises: generating a reception reference voltage, and wherein said step of generating a reception control signal comprises determining a difference between an amplitude of said reception reference signal and said reception reference voltage. In an embodiment, the method further comprises: receiving a calibration signal; amplifying said calibration signal, generating the transmission reference signal; generating a transmission control signal as a function of said transmission reference signal; and controlling a level of amplification in said step of amplifying said calibration signal as a function of said transmission control signal. In an embodiment, the method further comprises: generating a transmission reference voltage, wherein said step of generating a transmission control signal comprises determining a difference between an amplitude of said transmission reference signal and said transmission reference voltage.

BRIEF DESCRIPTION OF THE SEVERAL VIEWS OF THE DRAWINGS

For a better understanding of the disclosure, embodiments thereof are now described, purely by way of non-limiting example and with reference to the attached drawings, wherein.

DETAILED DESCRIPTION

In the following description, numerous specific details are given to provide a thorough understanding of embodiments. The embodiments can be practiced without one or more of the specific details, or with other methods, components, materials, etc. In other instances, well-known structures, materials, or operations, such as, for example, operational amplifiers, are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" "according to an embodiment" or "in an embodiment" and similar phrases in various places throughout this specification are not necessarily all referring to the same embodiment. Furthermore, the particular features, structures, or characteristics may be combined in any suitable manner in one or more embodiments.

The figures are not necessarily reflective of relative proportions and positioning of the structures shown therein.

The headings provided herein are for convenience only and do not interpret the scope or meaning of the embodiments.

Figure 2:
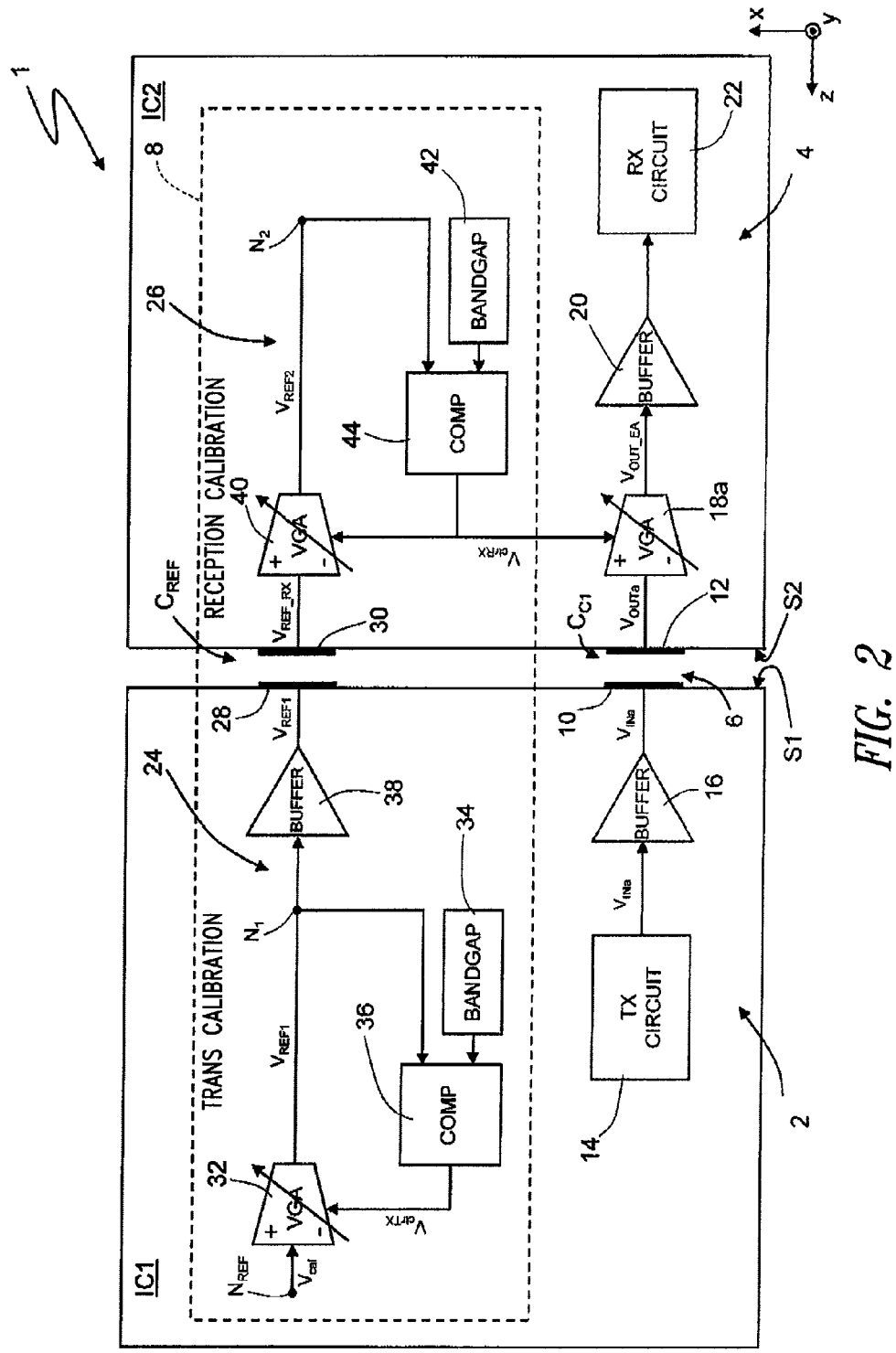
FIG. 2 shows a circuit diagram of an electronic capacitive-coupling communication circuit.

By way of example and without this implying any loss of generality, in what follows embodiments of the present disclosure are described with reference to the case where the integrated electronic devices of which it is desired to verify the alignment are chips, in particular a first chip IC1 and a second chip IC2. As shown in FIG. 2, the first and second chips IC1, IC2 define, respectively, a first top surface S1 and a second top surface S2, and are set in the so-called face-to-face mode, in such a way that the first and second top surfaces S1, S2 face one another. For instance, assuming that the first and second chips IC1, IC2 are formed by respective bodies of semiconductor material (not shown), the first and second top surfaces S1, S2 can be defined, respectively, by the bodies of semiconductor material of the first and second chips IC1, IC2. Alternatively, the first and second top surfaces S1, S2 can be defined by respective top regions (not shown) of the first and second integrated circuits IC1, IC2, arranged on the respective bodies of semiconductor material, and comprising, for example, metallizations and/or dielectric layers.

As described in greater detail hereinafter, the present disclosure envisages resorting to an electronic capacitive-coupling communication circuit, an embodiment of which, for reasons of brevity, will be referred to hereinafter as "communication circuit 1".

As shown in the embodiment of FIG. 2, the communication circuit 1 comprises: a first transmitter stage 2, formed in the first chip IC1; a first receiver stage 4, formed in the second chip IC2; and at least one first communications channel 6, which comprises a first coupling capacitor $C_{C1}$ and connects the first transmitter stage 2 and the first receiver stage 4. In addition, the communication circuit 1 comprises a reference channel 8, distributed between the first and second chips IC1, IC2, and described in greater detail hereinafter.

The first coupling capacitor $C_{C1}$ is formed by a first transmission electrode 10 and by a first reception electrode 12, which extend, respectively, on the first and second top surfaces S1, S2.

The first transmitter stage 2 comprises a transmitter circuit 14 and a first transmission buffer 16, which has an input connected to the transmitter circuit 14, and an output connected to the first transmission electrode 10.

In greater detail, the first transmission buffer 16 is a unit-gain amplifier circuit, and can be formed by a respective operational amplifier (not shown), the output terminal of which defines the output of the first transmission buffer 16 and is short-circuited to the negative input terminal of the operational amplifier. The output terminal is moreover connected to the first transmission electrode 10, whilst the positive input terminal of the operational amplifier is connected to the transmitter circuit 14.

In what follows, with regard to the example embodiments of buffers that will be mentioned and described, for reasons of simplicity, referred to as "input" and "output" are, respectively, the positive input terminal and the output terminal of the corresponding operational amplifiers, except where otherwise specified, assuming that these buffers are the same, from a circuit standpoint, as the first transmission buffer 16, and implying the short-circuit connection between the output terminals and the negative input terminals of the corresponding operational amplifiers.

Once again with reference to FIG. 2, the first receiver stage 4 comprises a first compensation amplifier 18a of a variable-gain analog type, a first reception buffer 20, and a receiver circuit 22. In particular, the first compensation amplifier 18a has, in addition to a control terminal described hereinafter, an input connected to the first reception electrode 12 and an output connected to the input of the first reception buffer 20. The output of the first reception buffer 20 is hence connected to the receiver circuit 22.

Both the first transmission buffer 16 and the first reception buffer 20 are such as to be able to drive the loads present on the respective outputs, in the case in point the first transmission electrode 10 and the receiver circuit 22. Consequently, when the transmitter circuit 14 generates a first communication signal $V_{INa}$ of an analog type and of a known amplitude, it is brought back onto the first transmission electrode 10, with consequent generation, on the first reception electrode 12, of a corresponding first received signal $V_{OUTa}$.

On account of the inevitable presence of parasitic capacitors connected to the first transmission electrode 10 and to the first reception electrode 12, even assuming that the first transmission buffer 16 is ideal, the amplitude of the first received signal $V_{OUTa}$ is attenuated with respect to the amplitude of the first communication signal $V_{INa}$. In practice, the parasitic capacitors and the first coupling capacitor $C_{C1}$ form a capacitive divider that causes an attenuation of the first received signal $V_{OUTa}$ with respect to the first communication signal $V_{INa}$. To compensate this attenuation either totally or in part, it is possible to act on the first compensation amplifier 18a, by appropriately varying the gain thereof. For this purpose, the control terminal of the first compensation amplifier 18a is connected to the reference channel 8, as described hereinafter.

In detail, the embodiment of the reference channel 8 illustrated comprises: a transmission calibration stage 24, formed in the first chip IC1; a reception calibration stage 26, formed in the second chip IC2; and a reference capacitor $C_{REF}$, formed by a transmission reference electrode 28 and by a reception reference electrode 30, which extend, respectively, on the first and second top surfaces S1, S2.

In detail, it is possible to obtain the reference capacitor $C_{REF}$ and the first coupling capacitor $C_{C1}$ in such a way that, when the first and second chips IC1, IC2 are aligned, they are the same as one another, and hence have one and the same capacitance. In particular, it is possible to form and set the transmission reference electrode 28 and the reception reference electrode 30 in such a way that they have the same shapes, respectively, as the first transmission electrode 10 and the first reception electrode 12. In addition, it is possible to obtain the transmission reference electrode 28 and the reception reference electrode 30 in such a way that, when the first and second chips IC1, IC2 are aligned, their mutual arrangement is the same as the mutual arrangement of the first transmission electrode 10 and of the first reception electrode 12. In this way, the reference capacitor $C_{REF}$ and the first coupling capacitor $C_{C1}$ introduce one and the same attenuation.

The transmission calibration stage 24 comprises a first reference amplifier 32, a first reference circuit 34, a first comparator stage 36, and a first reference buffer 38, which can be the same as the aforesaid first transmission buffer 16 and first reception buffer 20.

In detail, the first reference amplifier 32 is of a variable-gain analog type, and has an input, an output, and a control terminal. In particular, the input of the first reference amplifier 32 defines a first calibration node $N_{REF}$, whilst the output of the first reference amplifier 32 defines a first first-feedback node $N_1$, and is connected to the input of the first reference buffer 38, the output of which is connected to the transmission reference electrode 28. In addition, the output of the first reference amplifier 32 is connected to the first comparator stage 36; in particular, the first comparator stage 36 has an output and a first input and a second input, the output of the first reference amplifier 32 being connected to the first input of the first comparator stage 36. The second input of the first comparator stage 36 is connected to the first reference circuit 34, whilst the output of the first comparator stage 36 is connected to the control terminal of the first reference amplifier 32, in such a way that the first reference amplifier 32 and the first comparator stage 36 define a first feedback loop.

The reception calibration stage 26 comprises a second reference amplifier 40, a second reference circuit 42, and a second comparator stage 44. In what follows it is assumed, for reasons of simplicity, that the first calibration amplifier 18a and the second reference amplifier 40 are the same as one another, even though a person skilled in the art will be able to implement the present method even in the case where the first calibration amplifier 18a and the second reference amplifier 40 are different. Possibly, also the first reference amplifier 32 can be the same as the first calibration amplifier 18a and as the second reference amplifier 40.

In detail, from the circuit standpoint, the second comparator stage 44 is the same as the first comparator stage 36, and hence has an output and a first input and a second input. In addition, the second reference amplifier 40 is of a variable-gain analog type, and has an input, an output, and a control terminal. The input of the second reference amplifier 40 is connected to the reception reference electrode 30, whilst the output of the second reference amplifier 40 defines a first second-feedback node $N_2$, and is connected to the first input of the second comparator stage 44. The second input of the second comparator stage 44 is connected to the second reference circuit 42, whilst the output of the second comparator stage 44 is connected to the control terminal of the second reference amplifier 40 in such a way that the second reference amplifier 40 and the second comparator stage 44 define a second feedback loop. In addition, the output of the second comparator stage 44 is connected to the control terminal of the first compensation amplifier 18a.

In greater detail, the first and second reference circuits 34, 42 supply, respectively, a first reference voltage $V_{BG1}$ and a second reference voltage $V_{BG2}$, both of a D.C. type. In particular, both the first reference circuit 34 and second reference circuit 42 may be formed by a respective bandgap voltage reference, commonly known as bandgap circuits.

Bandgap circuits are used for generating reference voltages within integrated circuits in which the bandgap circuits themselves are integrated. In particular, given a generic bandgap formed within a substrate of semiconductor material, this bandgap circuit is able to supply a respective reference voltage that is very close to the bandgap voltage that characterizes this semiconductor material, or in any case depends, to a first approximation, only upon this bandgap voltage. In other words, to a first approximation, the reference voltage is a function of the semiconductor material in which the bandgap circuit is obtained and does not depend upon other factors, such as, for example, the temperature, or else upon the technological processes that have led to formation of the integrated circuit in which the bandgap circuit itself is present. Consequently, the reference voltages supplied by bandgap circuits are substantially immune from factors such as, for example, process non-uniformities, differences in technology (for example, 1V CMOS technology, or else 3.3V CMOS technology, BiCMOS) and temperature. Purely by way of example, in the case where the semiconductor material is silicon, various types of bandgap circuits are available, capable of supplying reference voltages very close to 1.2 V.

Figure 3:
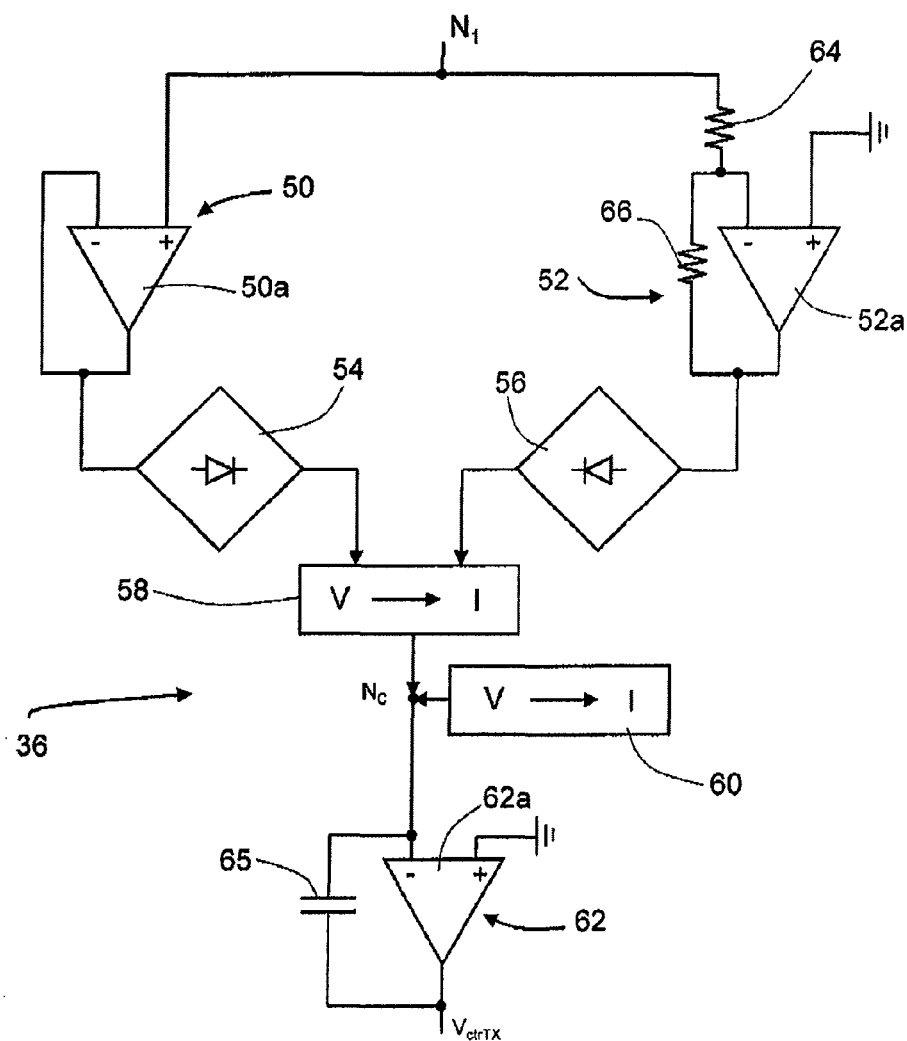
FIG. 3 shows a circuit diagram of a comparator stage.

FIG. 3 shows in greater detail an embodiment of the first comparator stage 36, which is connected to the first first-feedback node $N_1$. In particular, in the embodiment illustrated in this figure, the first comparator stage 36 comprises a first comparison buffer 50 and a second comparison buffer 52, a first rectifier 54 and a second rectifier 56 both of a single half-wave type, a first voltage-to-current converter 58 and a second voltage-to-current converter 60, and an integrator 62.

In greater detail, the first and second comparison buffers 50, 52 are formed by respective operational amplifiers, designated by 50a and 52a. The first first-feedback node $N_1$ is connected to the input of the first comparison buffer 50, i.e., to the positive input terminal of the operational amplifier 50a of the first comparison buffer 50. In addition, the first first-feedback node $N_1$ is connected to the negative input terminal of the operational amplifier 52a of the second comparison buffer 52, possibly by interposition of a buffer resistor 64 connected in series between the first first-feedback node $N_1$ and the negative input terminal of the operational amplifier 52a of the second comparison buffer 52, the positive input terminal of which is connected to ground.

In addition, connected between the negative input terminal and the output terminal of the operational amplifier 52a of the second comparison buffer 52 is a feedback resistor 66; as illustrated, the second comparison buffer 52 is an inverting buffer.

The first and second rectifiers 54, 56 have respective inputs, connected, respectively, to the output of the first comparison buffer 50 and to the output of the second comparison buffer 52, and hence to the output terminals of the operational amplifiers 50a, 52a of the first and second comparison buffers 52. In addition, both the first rectifier 54 and the second rectifier 56 have a respective output.

The first voltage-to-current converter 58 has one output and two input terminals, the latter being connected, respectively, to the output of the first rectifier 54 and to the output of the second rectifier 56. Operatively, when a load is present on the output of the first voltage-to-current converter 58, the load is traversed by a current that does not depend upon the load itself, but rather just upon the voltage present between the inputs of the first voltage-to-current converter 58.

The second voltage-to-current converter 60 can be the same as the first voltage-to-current converter 58, and hence it also has one output and two input terminals (not shown). In particular, the two input terminals of the second voltage-to-current converter 60 define the aforementioned second input of the first comparator stage 36 and are connected (connection not shown) to the first reference circuit 34 in such a way that present across them is the first reference voltage $V_{BG1}$. Instead, the output of the second voltage-to-current converter 60 is connected to the output of the first voltage-to-current converter 58, and defines a comparison node $N_C$.

The integrator 62 is formed by a respective operational amplifier 62a and by an integration capacitor 65. In particular, the negative input terminal of the operational amplifier 62a is connected to the comparison node $N_C$. In addition, the negative input terminal of the operational amplifier 62a is connected, through the integration capacitor 65, to the output terminal of the operational amplifier 62a itself, which is in turn connected to the control terminal of the first reference amplifier 32 (connection not shown). In addition, the positive input terminal of the operational amplifier 62a is connected to ground.

The currents generated by the first and second voltage-to-current converters 58, 60 converge in the comparison node $N_C$, these currents having directions such that the integrator 62 integrates a current equal to the difference between the currents generated by the first and second voltage-to-current converters 58, 60. On the output of the integrator 62 there is hence generated a first control signal $V_{ctrTX}$, which is supplied to the control terminal of the first reference amplifier 32.

The second comparator stage 44 is similar to the first comparator stage 36, and supplies a second control signal $V_{ctrRX}$ on the control terminals of the second reference amplifier 40 and of the first compensation amplifier 18a.

Operatively, the behavior of the communication circuit 1 is now described assuming that the transmitter circuit 14 transmits a first communication signal $V_{INa}$ of a time-variable type and of known amplitude, as has been said. In addition, it is assumed that the first calibration node $N_{REF}$ receives a calibration signal $V_{cal}$ of a time-variable type, which can differ from the first communication signal $V_{INa}$. Alternatively, it is in any case possible to connect the first calibration node $N_{REF}$ to the transmitter circuit 14 in such a way that the calibration signal $V_{cal}$ is the same as the first communication signal $V_{INa}$.

In use, on the first transmission electrode 10 the first communication signal $V_{INa}$ is present; consequently, on the first reception electrode 12, and hence at input to the first compensation amplifier 18a, the first received signal $V_{OUTa}$ is present. Instead, at output from the first compensation amplifier 18a a $V_{OUT\_Ea}$ is present.

As regards, instead, the reference channel 8, present on the output of the first reference amplifier 32, and hence present on the first first-feedback node $N_1$, is a first reference signal $V_{REF1}$, which is likewise present on the transmission reference electrode 28. Given the capacitive coupling between the transmission reference electrode 28 and the reception reference electrode 30, at input to the second reference amplifier 40 a coupling signal $V_{REF\_RX}$ is set up. At output from the second reference amplifier 40, and hence on the first second-feedback node $N_2$, a second reference signal $V_{REF2}$ is, instead, present.

In greater detail, thanks to the first feedback loop, the first control signal $V_{ctrTX}$ controls the gain of the first reference amplifier 32 in such a way that the first reference signal $V_{REF1}$ (time-variable) has an amplitude independent of the amplitude of the calibration signal $V_{cal}$ and directly proportional to the first reference voltage $V_{BG1}$ generated by the first reference circuit 34; in other words, the following relation applies: $V_{REF1}=k_1 \cdot V_{BG1}$. In detail, in steady-state conditions, the first control signal $V_{ctrTX}$ assumes a constant value that depends upon the amplitude of the calibration signal $V_{cal}$ and upon the first reference voltage $V_{BG1}$.

Likewise, on account of the presence of a capacitive divider formed by the reference capacitor $C_{REF}$ and by inevitable parasitic capacitors connected to the reference capacitor $C_{REF}$, the coupling signal $V_{REF\_RX}$ has an amplitude smaller than the first reference signal $V_{REF1}$. However, thanks to the second feedback loop, the second control signal $V_{ctrRX}$ controls the gain of the second reference amplifier 40 in such a way that the second reference signal $V_{REF2}$, which is also time-variable, has an amplitude directly proportional to the second reference voltage $V_{BG2}$ generated by the second reference circuit 42, irrespective of the alignment or misalignment of the first and second chips IC1, IC2. In other words, the following relation applies: $V_{REF2}=k_2 \cdot V_{BG2}$. In detail, in steady-state conditions the second control signal $V_{ctrRX}$ assumes a constant value that depends upon the amplitude of the coupling signal $V_{REF\_RX}$ and upon the second reference voltage $V_{BG2}$.

Assuming that the first and second reference voltages $V_{BG1}$, $V_{BG2}$ are the same as one another, and that also the architectures of the first and second comparator stages 36, 44 are the same as one another (and hence $k_1=k_2=k$), the following relation applies $AV_{REF1}=k \cdot V_{BG1}=AV_{REF2}=k \cdot V_{BG2}$, where $AV_{REF1}$ and $AV_{REF2}$ are, respectively, the amplitudes of the first and second reference signals $V_{REF1}$, $V_{REF2}$. The second reference signal $V_{REF2}$ has the same amplitude and the same temporal evolution as the first reference signal $V_{REF1}$, which, amongst other things, has the same temporal evolution as the calibration signal $V_{cal}$. In other words, the second control signal $V_{ctrRX}$ determines the gain of the second reference amplifier 40 in such a way as to compensate for the attenuation introduced by the capacitive divider formed by the reference capacitor $C_{REF}$, irrespective of the alignment or misalignment of the first and second chips IC1, IC2.

If the first and second chips IC1, IC2 are effectively aligned with respect to one another, and in the case where the reference capacitor $C_{REF}$ and the first coupling capacitor $C_{C1}$ are such as to introduce, in conditions of alignment, one and the same attenuation, given that the second control signal $V_{ctrRX}$ controls also the gain of the first compensation amplifier 18a, the attenuation introduced by the capacitive divider associated to the first coupling capacitor $C_C$ is also compensated. Consequently, the first compensated signal $V_{OUT\_Ea}$ has, in addition to the same temporal evolution, also the same amplitude as the first communication signal $V_{INa}$. Likewise, also in the case where the first coupling capacitor $C_{C1}$ and the reference capacitor $C_{REF}$ are different from one another (even in conditions of alignment), it is in any case possible to establish a first relation of alignment (for example, a ratio) between the amplitudes of the first compensated signal $V_{OUT\_EA}$ and of the first communication signal $V_{INa}$, which is valid in conditions of alignment and depends upon the ratio between the attenuations introduced by the first coupling capacitor $C_{C1}$ and by the reference capacitor $C_{REF}$.

In the case of misalignment, present between the amplitudes of the first compensated signal $V_{OUT\_Ea}$ and of the first communication signal $V_{INa}$ is a first effective relation, different from the aforementioned first relation of alignment, which depends in particular upon the characteristics (degree of a translation and of a possible rotation) of the misalignment. In fact, the control signal $V_{ctrRX}$ continues to control the gain of the second reference amplifier 40 in such a way as to compensate for the attenuation introduced by the capacitive divider formed by the reference capacitor $C_{REF}$; however, given that, on account of the misalignment, the attenuation introduced by the first coupling capacitor $C_{C1}$ is no longer equal to the attenuation introduced by the reference capacitor $C_{REF}$, hence the gain introduced by the first calibration amplifier 18a is under or oversized with respect to the attenuation introduced by the first coupling capacitor $C_{C1}$.

The present method hence envisages determination of the first relation of alignment, regarding the amplitudes of the first compensated signal $V_{OUT\_Ea}$ and of the first communication signal $V_{INa}$, and valid in conditions of alignment.

In this way, if it is desired to verify the possible alignment between the first and second chips IC1, IC2 at a generic instant T, it is possible to detect the amplitudes of the first compensated signal $V_{OUT\_Ea}$ and of the first communication signal $V_{INa}$ in this instant T, determining the corresponding first effective relation, and comparing the first effective relation with the first relation of alignment. In the case where the first effective relation departs, taking into account the inevitable tolerances, from the first relation of alignment, it is inferred that the first and second chips IC1, IC2 are not aligned.

Figure 1:
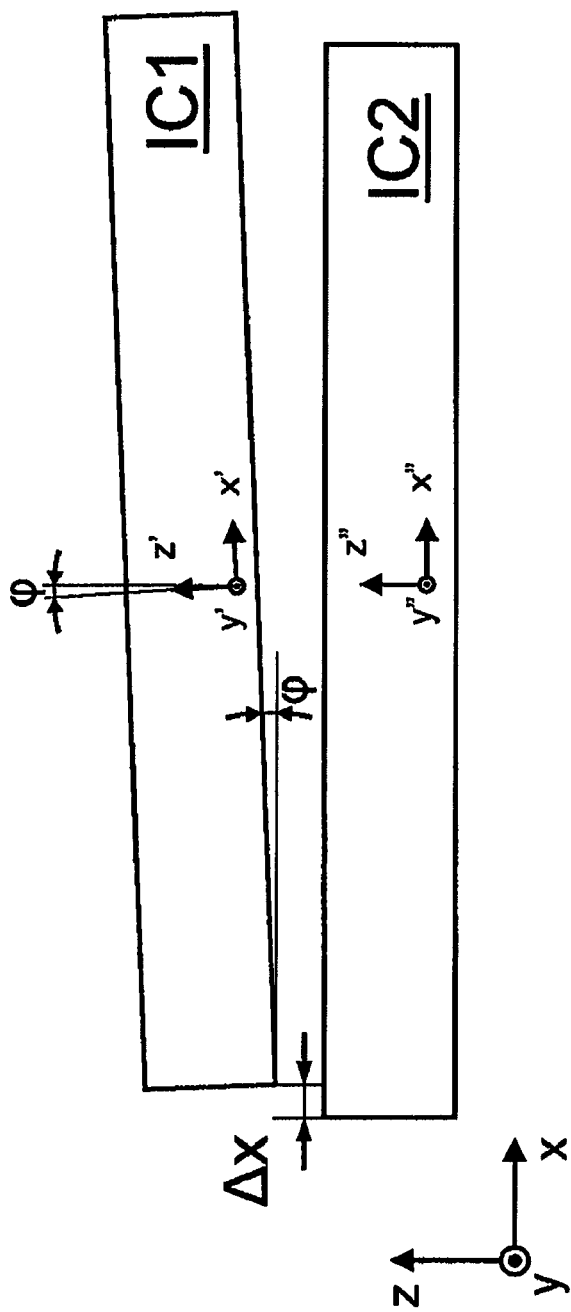
FIG. 1 shows a side view of two chips.

In particular, a possible rotation, for example, of the first chip IC1 with respect to the second chip IC2 (angle ϕ other than zero, with reference to FIG. 1), can be conveniently detected if the transmission reference electrode 28 and the reception reference electrode 30 are, respectively, the same as the first transmission electrode 10 and the first reception electrode 12. In this case, the rotation entails that the amplitude of the first compensated signal $V_{OUT\_Ea}$ differs from the amplitude of the first communication signal $V_{INa}$. Likewise, a possible translation along the axes x or y of the reference system x, y, z, for example, of the first chip IC1 with respect to the second chip IC2, can be appropriately detected using a first coupling capacitor $C_{C1}$ different from the reference capacitor $C_{REF}$.

In order to detect the amplitudes of the first compensated signal $V_{OUT\_Ea}$ and of the first communication signal $V_{INa}$, it is possible to contact with probes the transmitter circuit 14 and the receiver circuit 22, it being possible for these probes to be in turn connected to an external processor (see FIG. 7) that has the tasks of storing the first relation of alignment, determining the first effective relation, and comparing the first effective relation with the first relation of alignment. Alternatively, once again in order to detect the amplitudes of the first compensated signal $V_{OUT\_Ea}$ and of the first communication signal $V_{INa}$, it is possible to integrate a first peak-detector circuit and a second peak-detector circuit (not shown) in the first and second dice IC1, IC2, respectively, so that they are connected to the transmitter circuit 14 and to the receiver circuit 22, respectively.

In addition, it is possible to integrate, alternatively in the first chip IC1 or in the second IC2, a processing circuit (see FIG. 7), connected to the first peak-detector circuit and to the second peak-detector circuit and configured so as to store the first relation of alignment, determine the first effective relation, and comparing the first effective relation with the first relation of alignment.

Figure 4:
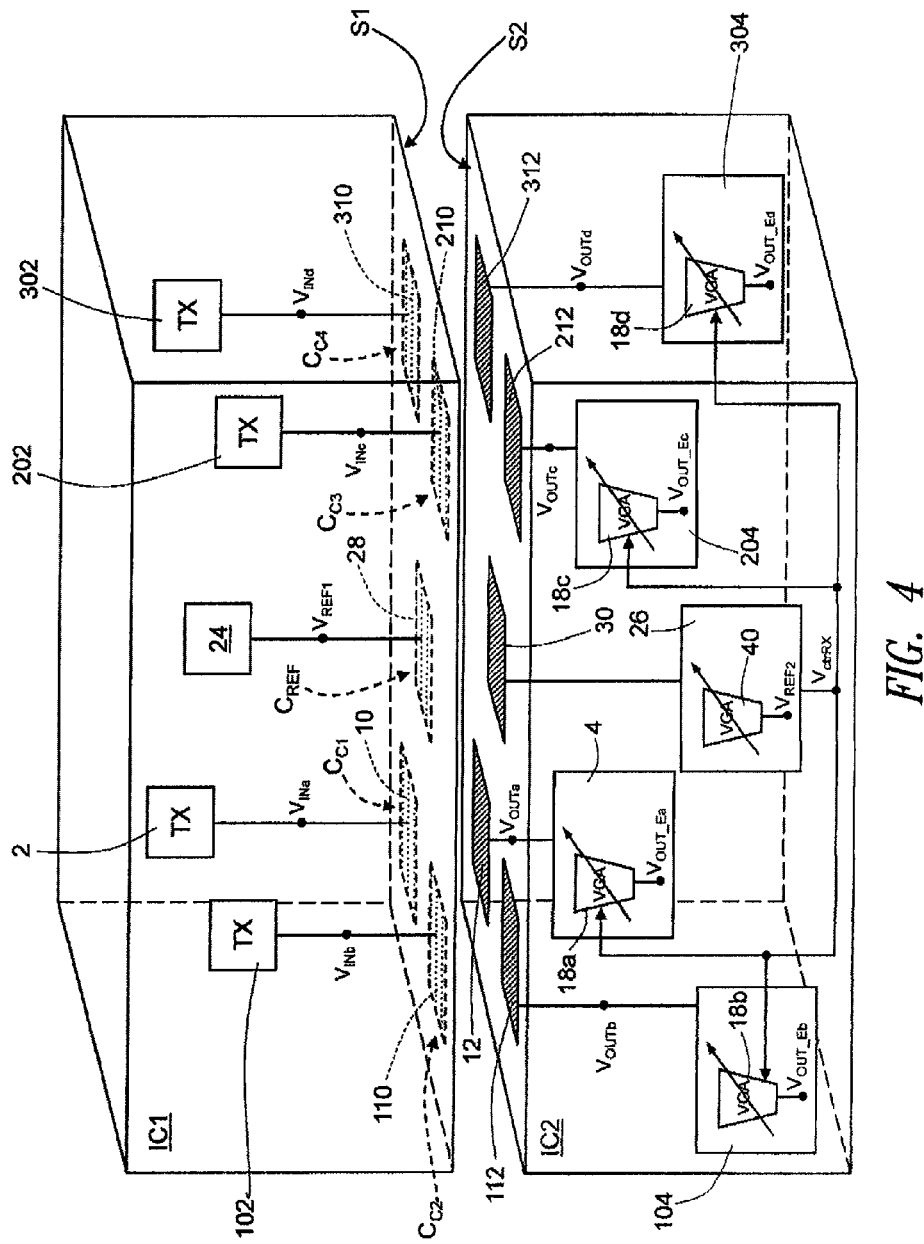
FIG. 4 is a schematic illustration of a perspective view of a first chip and of a second chip.

As illustrated by way of example in FIG. 4, the transmission reference electrode 28 and the reception reference electrode 30 can be set at the center, respectively, of the first and second top surfaces S1, S2 of the first and second chips IC1, IC2. In addition, the first transmission electrode 10 and the first reception electrode 12 can be set so as to be centered, respectively, in corresponding vertices of a first imaginary rectangle and a second imaginary rectangle having respective centers coinciding with the centers of the transmission reference electrode 28 and of the reception reference electrode 30.

In addition, there may for example be present a second transmitter stage IC2, a third transmitter stage 202, and a fourth transmitter stage 302, a second receiver stage 104, a third receiver stage 204, and a fourth receiver stage 304, and a second communications channel, a third communications channel, and a fourth communications channel, which comprise, respectively, a second coupling capacitor $C_{C2}$, a third coupling capacitor $C_{C3}$, and a fourth coupling capacitor $C_{C4}$, and connect, respectively, the second transmitter stage IC2 and the second receiver stage 104, the third transmitter stage 202 and the third receiver stage 204, and the fourth transmitter stage 302 and the fourth receiver stage 304.

In detail, the second, third, and fourth coupling capacitors $C_{C2}, C_{C3}, C_{C4}$ are formed, respectively, by a second transmission electrode 110 and a second reception electrode 112, by a third transmission electrode 210 and a third reception electrode 212, and by a fourth transmission electrode 310 and a fourth reception electrode 312.

The second, third, and fourth transmission electrodes 110, 210, 310 extend on the first top surface S1, for example, centered in the respective vertices of the first imaginary rectangle. Likewise, the second, third, and fourth reception electrodes 112, 212, 312 extend on the second top surface S2, for example, centered in the corresponding vertices of the second imaginary rectangle. As illustrated, the first, second, third, and fourth transmission electrodes 10, 110, 210, 310 surround the transmission reference electrode 28, whilst the first, second, third, and fourth reception electrodes 12, 112, 212, 312 surround the reception reference electrode 30.

The second, third, and fourth receiver stages 104, 204, 304 can be the same as the first receiver stage, and hence comprise, respectively, a second calibration amplifier 18b, a third calibration amplifier 18c, and a fourth calibration amplifier 18d, the control terminals of which are connected to the output of the second comparator stage 44 in such a way as to receive the second control signal $V_{ctrRX}$. In addition, transmitted on the second transmission electrode 110, the third transmission electrode 210, and the fourth transmission electrode 310 are, respectively, a second communication signal $V_{INb}$, a third communication signal $V_{INc}$, and a fourth communication signal $V_{INd}$, which are, for example, the same as the first communication signal $V_{INa}$, and hence on the second, third, and fourth reception electrodes 112, 212, 312 there set up, respectively, a second received signal $V_{OUTb}$, a third received signal $V_{OUTc}$, and a fourth received signal $V_{OUTd}$. Consequently, on the respective outputs, the second, third, and fourth calibration amplifiers 18b, 18c, 18d generate, respectively, a second compensated signal $V_{OUT\_Eb}$, a third compensated signal $V_{OUT\_Ec}$, and a fourth compensated signal, $V_{OUT\_Ed}$.

In greater detail, it is possible to obtain the second, third, and fourth coupling capacitors $C_{C2}, C_{C3}, C_{C4}$ in such a way that, when the first and second chips are aligned, they have the same capacitance as the first coupling capacitor $C_{C1}$. In addition, it is possible to obtain the second coupling capacitor $C_{C2}$, the third coupling capacitor $C_{C3}$, and the fourth coupling capacitor $C_{C4}$ in such a way that the second, third, and fourth transmission electrodes 110, 210, 310 have the same shape as the first transmission electrode 10 (possibly coinciding with the shape of the transmission reference electrode 28), and that the second, third, and fourth reception electrodes 112, 212, 312 have the same shape as the first reception electrode 12 (possibly coinciding with the shape of the reception reference electrode 30). In addition, the pairs of electrodes formed, respectively, by the second transmission electrode 110 and the second reception electrode 112, by the third transmission electrode 210 and the third reception electrode 212, as well as by the fourth transmission electrode 310 and the fourth reception electrode 312, can be formed in such a way that, in conditions of alignment, the mutual arrangement of the respective electrodes is the same as the mutual arrangement of the transmission reference electrode 28 and of the reception reference electrode 30. In this way, the second, third, and fourth coupling capacitors $C_{C2}$, $C_{C3}$, $C_{C4}$ introduce the same attenuation introduced by the reference capacitor $C_{REF}$.

Given that the second control signal $V_{ctrRX}$ controls also the gain of the second, third, and fourth compensation amplifiers 18b-18d, if the first and second chips IC1, IC2 are effectively aligned with respect to one another, and in the case where the reference capacitor $C_{REF}$ and the second, third, and fourth coupling capacitors $C_{C2}$, $C_{C3}$, $C_{C4}$ are effectively such as to introduce, in conditions of alignment, one and the same attenuation, also the attenuations introduced by the second, third, and fourth coupling capacitors $C_{C2}$, $C_{C3}$, $C_{C4}$ are compensated. Consequently, the second, third, and fourth compensated signals $V_{OUT\_Eb}$, $V_{OUT\_Ec}$, $V_{OUT\_Ed}$ have, in addition to the same time evolutions, also the same amplitudes as the second, third, and fourth communication signals $V_{INb}$, $V_{INc}$, $V_{INd}$.

Likewise, also in the case where the second, third, and fourth coupling capacitors $C_{C2}$, $C_{C3}$, $C_{C4}$ are different (even in conditions of alignment) from one another and/or from the reference capacitor $C_{REF}$, it is in any case possible to establish a second relation of alignment, a third relation of alignment, and a fourth relation of alignment that are valid in conditions of alignment and that correspond, respectively, to the second communication signal $V_{INb}$ and the second compensated signal $V_{OUT\_Eb}$, the third communication signal $V_{INc}$, and the third compensated signal $V_{OUT\_Eb}$, and the fourth communication signal $V_{INd}$, and the fourth compensated signal $V_{OUT\_E}$.

In the case of misalignment, instead of the aforementioned second, third, and fourth relations of alignment, there apply, respectively, a second effective relation, a third effective relation, and a fourth effective relation.

Consequently, by detecting (for example in a way similar to the one described with regard to the first communication signal $V_{INa}$ and to the first compensated signal $V_{OUT\_Ea}$) the amplitudes of the second, third, and fourth communication signals $V_{INb}$, $V_{INc}$, $V_{INd}$ and of the second, third, and fourth compensated signals $V_{OUT\_Eb}$, $V_{OUT\_Ec}$, $V_{OUT\_E}$, determining the aforementioned second, third, and fourth effective relations, and comparing them with the corresponding second, third, and fourth relations of alignment, it is possible to obtain further information on the possible misalignment of the first and second chips IC1, IC2. In addition, by arranging the first, second, third, and fourth coupling capacitors $C_{C1}$, $C_{C2}$, $C_{C3}$, $C_{C4}$ as far away as possible from the reference capacitor $C_{REF}$, compatibly with the dimensions of the first and second chips IC1, IC2, it is possible to detect misalignments, in particular rotations, of modest degree.

Figure 5A:
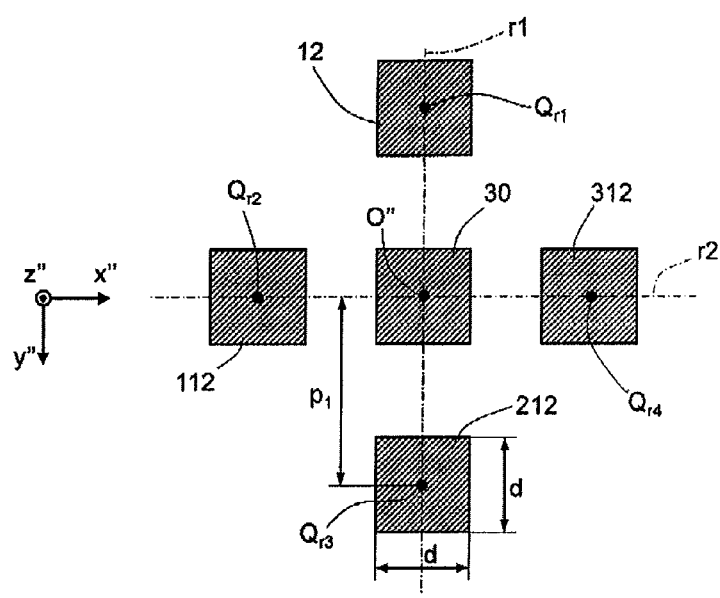
FIGS. 5a and 5b show in top plan view a first arrangement and a second arrangement of electrodes, respectively, on the second chip and on the first chip.
Figure 5B:
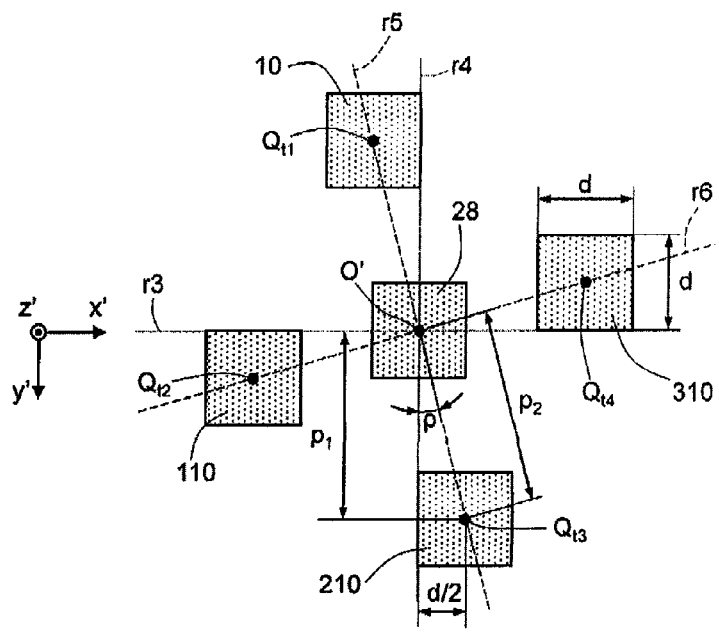

As shown by way of example in FIGS. 5a, 5b, it is in any case possible to arrange the first, second, third, and fourth coupling capacitors $C_{C1}$, $C_{C2}$, $C_{C3}$, $C_{C4}$, as well as the reference capacitor $C_{REF}$, in a way different from what has been described and shown previously. In particular, a different embodiment is described in what follows, assuming that the electrodes of the aforementioned capacitors have a negligible thickness.

In detail, as shown in FIG. 5a, the first, second, third, and fourth reception electrodes 12, 112, 212, 312 can all have the shape, for example, of a square with sides of length d and parallel alternatively to the axis x" and to the axis y", and be set on the second top surface S2 in such a way that the respective geometrical centers $Q_{r1}$, $Q_{r2}$, $Q_{r3}$, $Q_{r4}$ are at the same distance from a first central point O" of the second top surface S2, with distance, for example equal to $p_1$. In addition, the first two of these electrodes, for example the first reception electrode 12 and the third reception electrode 212, can be set along a first straight line r1 passing through the first central point O" and parallel to the axis y", whilst the other two of them, for example the second reception electrode 112 and the fourth reception electrode 312, can be set along a second straight line r2, passing through the first central point O" and parallel to the axis x". As illustrated, the first and third reception electrodes 12, 212, as likewise the second and fourth reception electrodes 112, 312, are set specular with respect to the first central point O". In addition, the first and third reception electrodes 12, 212 have geometrical centers $Q_{r1}$, $Q_{r3}$ that lie on the first straight line r1, whilst the second and fourth reception electrodes 112, 312 have geometrical centers $Q_{r2}$, $Q_{r4}$ that lie on the second straight line r2. Likewise, also the reception reference electrode 30 can have the shape of a square with side d and geometrical center coinciding with the first central point O".

As shown in FIG. 5b, also the first, second, third, and fourth transmission electrodes 10, 110, 210, 310 can all have the shape, for example, of a square with sides of length d and parallel alternatively to the axis x' and to the axis y', and be set on the first top surface S1 in such a way that the respective geometrical centers $Q_{t1}$, $Q_{t2}$, $Q_{t3}$, $Q_{t4}$ are at the same distance from a second central point O' of the first top surface S1, for example, with distance $p_2$. In addition, the first two of these electrodes, for example, the first and third transmission electrodes 10, 210, can be set with respect to the second central point O' in a way similar to how the first and third reception electrodes 12, 212 are set with respect to the first central point O", but for a translation, respectively, equal to −d/2 and +d/2 along the axis x'. Likewise, the other two electrodes, for example, the second and fourth transmission electrodes 110, 310, can be set with respect to the second central point O' in a way similar to how the second and fourth reception electrodes 112, 312 are set with respect to the first central point O", but for a translation, respectively, equal to +d/2 and −d/2 along the axis y'. The transmission reference electrode 28 can also have the shape of a square with side d and geometrical center coinciding with the second central point O'.

In greater detail, assuming a Cartesian reference system with axes parallel to the axes of the reference system x', y', z' and centered in the second central point O', the geometrical centers $Q_{t1}$, $Q_{t2}$, $Q_{t3}$, $Q_{t4}$ have, respectively, co-ordinates equal to $(-d/2,-p_1)$, $(-p_1,d/2)$, $(d/2,p_1)$ and $(p_1,-d/2)$. In addition, we have:

$$p_2 = \sqrt{\left(\frac{d}{2}\right)^2 + p_1^2} \qquad (1)$$

Defining a third straight line r3 and a fourth straight line r4, which pass through the second central point O' and are parallel, respectively, to the axes x' and y', the geometrical centers $Q_{t1-t4}$ of the first, second, third, and fourth transmission electrodes 10, 110, 210, 310 do not lie on these third and fourth straight lines r3, r4. In particular, defining an angle ρ with vertex centered in the second central point O' and such that:

$$\rho = \mathrm{arc}tg\left(\frac{d}{2} \cdot \frac{1}{p_1}\right) \quad (2)$$

we find that the first and third geometrical centers $Q_{t1}$, $Q_{t3}$ lie on a fifth straight line r5 that forms the angle θ with the fourth straight line r4, whilst the second and fourth geometrical centers $Q_{t2}$, $Q_{t4}$ lie on a sixth straight line r6 that forms the angle ρ with the third straight line r3.

Figure 6A:
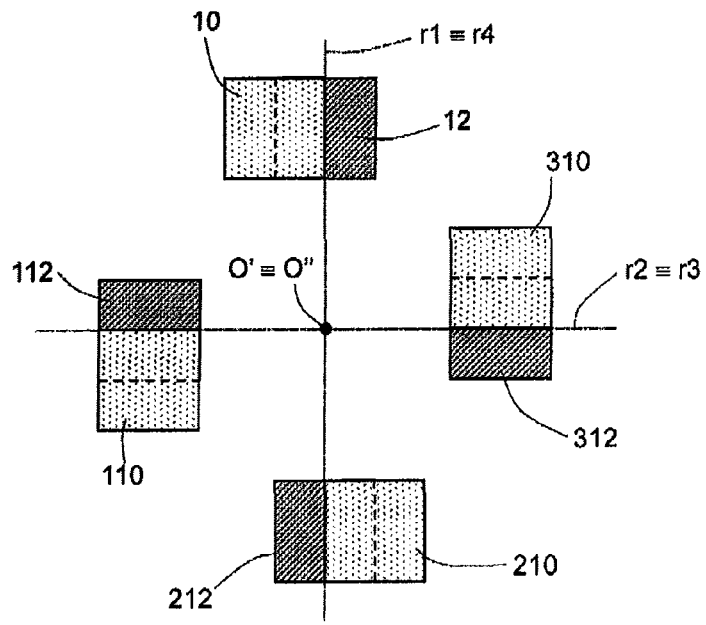
FIGS. 6a and 6b show in top plan view the first and second arrangements of electrodes appearing in FIGS. 5a and 5b, respectively, in the case where the first and second chips are aligned and misaligned.

As shown in FIG. 6a (where for reasons of simplicity the transmission reference electrode 28 and reception reference electrode 30 are not shown), in the case of alignment between the first and second chips IC1, IC2, and assuming that the first, second, third, and fourth communication signals $V_{INa}$, $V_{INb}$, $V_{INc}$, $V_{INd}$ have one and the same amplitude $V_A$, we find that the first, second, third, and fourth compensated signals $V_{OUT\_Ea}$, $V_{OUT\_Eb}$, $V_{OUT\_Ec}$, $V_{OUT\_Ed}$ have amplitude equal to $V_A/2$. In fact, in the case of alignment, i.e., in the absence of rotation and when the first and second central points O'', O' are aligned with respect to one another, the capacitance of each of the first, second, third, and fourth coupling capacitors $C_{C1}$-$C_{C4}$ is equal to half the capacitance of the reference capacitor $C_{REF}$, given that the first, second, third, and fourth transmission electrodes 10, 110, 210, 310 are, respectively, superimposed on the first, second, third, and fourth reception electrodes 12, 112, 212, 312 with area of overlapping equal to $d^2/2$, i.e., to half of the area of overlapping of the transmission reference electrode 28 and reception reference electrode 30.

Figure 6B:
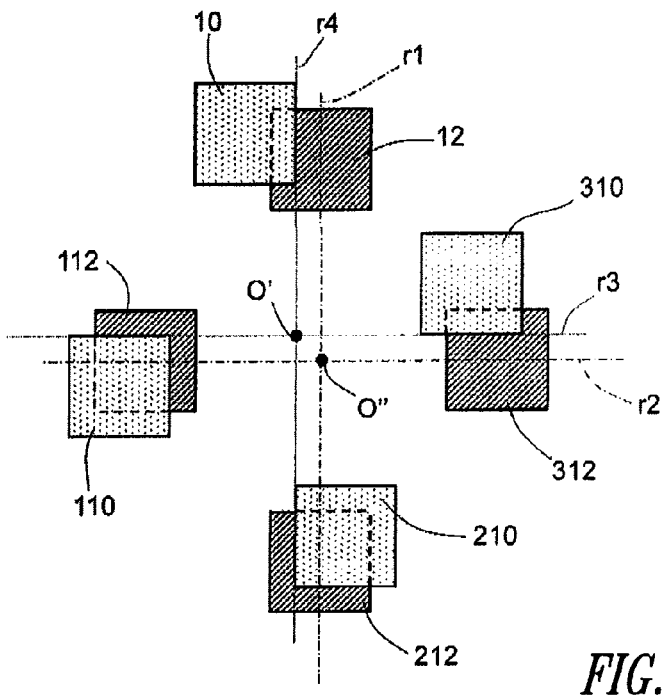

In the case of misalignment, as shown in FIG. 6b (where for reasons of simplicity the transmission reference electrode 28 and reception reference electrode 30 are not shown), each of the first, second, third, and fourth coupling capacitors $C_{C1}$-$C_{C4}$ introduce a respective capacitance, which has a respective relation with the capacitance of the reference capacitor $C_{REF}$; this relation depends upon the misalignment. Consequently, each of the first, second, third, and fourth compensated signals $V_{OUT\_Ea}$, $V_{OUT\_Eb}$, $V_{OUT\_Ec}$, $V_{OUT\_Ed}$ has an amplitude of its own, which can be greater or less than $V_A/2$, according to a direction of translation in which this misalignment occurs, which will be referred to in what follows as "direction of misalignment".

It is hence possible to detect the presence or absence of a condition of alignment considering individually each of the amplitudes of the first, second, third, and fourth compensated signals $V_{OUT\_Ea}$, $V_{OUT\_Eb}$, $V_{OUT\_Ec}$, $V_{OUT\_Ed}$, and verifying whether the amplitude considered is alternatively equal to, or greater or less than $V_A/2$. In general, even in the case where the amplitudes of the first, second, third, and fourth communication signals $V_{INa}$, $V_{INb}$, $V_{INc}$, $V_{INd}$ are not the same as one another, it is in any case possible to infer, in a way in itself known, information on the direction of misalignment. For this purpose, it is possible to compare the amplitudes of the first, second, third, and fourth compensated signals $V_{OUT\_Ea}$, $V_{OUT\_Eb}$, $V_{OUT\_Ec}$, $V_{OUT\_Ed}$, respectively, with the amplitudes of the first, second, third, and fourth communication signals $V_{INa}$, $V_{INb}$, $V_{INc}$, $V_{INd}$ divided by two.

On the basis of what is shown in FIGS. 5a, 5b, variations are in any case possible, such as variations in the shape of the electrodes, as previously described in connection with the other embodiments.

Figure 7:
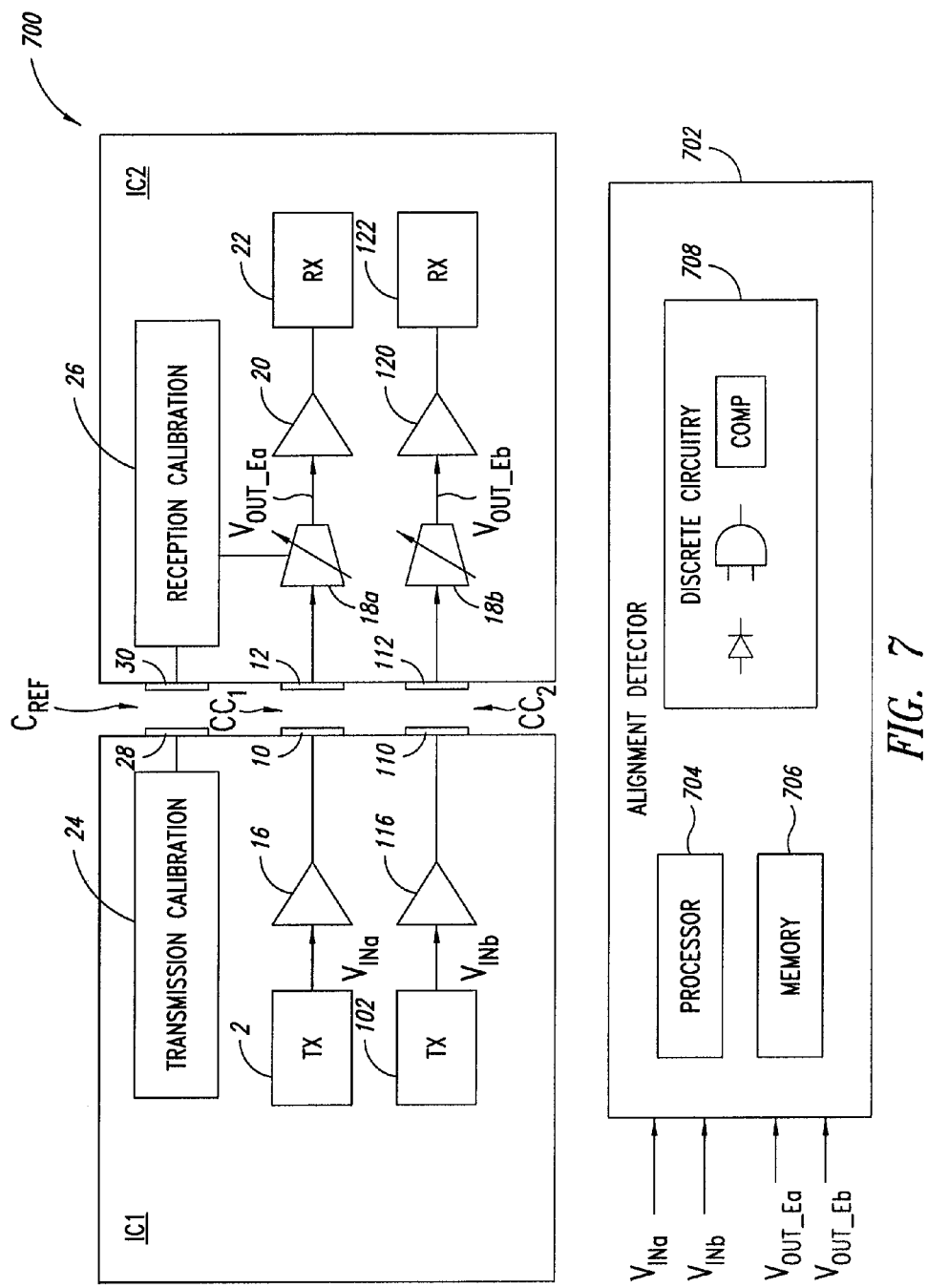
FIG. 7 is a functional block diagram of an embodiment of a system configured to determine whether a plurality of chips are aligned or misaligned.

FIG. 7 is a functional block diagram of a system 700 comprising a first integrated circuit IC1, and second integrated circuit IC2 coupled to the first integrated circuit IC1, and an alignment detector 702. In FIG. 7, similar reference numbers are used to denote elements that are similar to embodiments of the corresponding elements of FIGS. 2 and 4. The alignment detector is configured to determine whether the first integrated circuit IC1 and the second integrated circuit IC2 are properly aligned. For example, the alignment detector 702 may be configured to determine whether the first and second integrated circuits are aligned based on the amplitudes of the respective communication signals (as illustrated $V_{INa}$, $V_{INb}$) and corresponding compensated signals (as illustrated $V_{OUT\_Ea}$, $V_{OUT\_Eb}$).

As illustrated, the alignment detector 702 comprises one or more processors 704, one or more memories 706 and discrete circuitry 708. As illustrated, the discrete circuitry comprises one or more rectifiers, one or more logic gates, and one or more comparators, but other or additional discrete circuitry may be employed. The alignment detector 702 may be configured to use one or more of the processors, memory and discrete circuitry components to determine whether the first integrated circuit IC1 and the second integrated circuit IC2 are properly aligned. The alignment detector 702 may be coupled to signals on the integrated circuits using probes, traces, and various other methods of electrically coupling components together, and various combinations thereof. As illustrated, the alignment detector 702 is separate from the first integrated circuit IC1 and the second integrated circuit IC2. In some embodiments the aligment detector may be partially or wholly integrated into one or both of the integrated circuits IC1, IC2.

Figure 8:
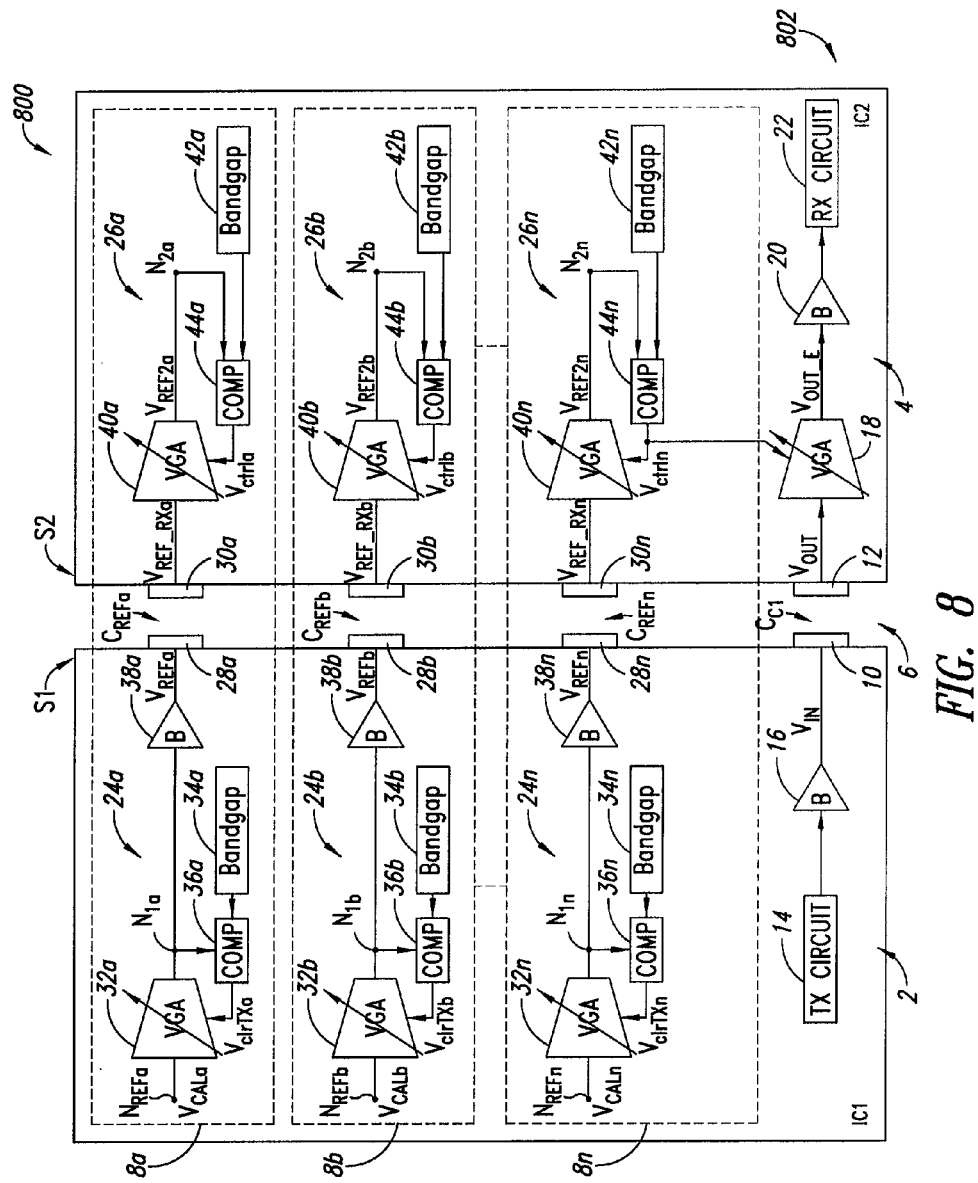
FIG. 8 shows a circuit diagram of an embodiment of an electronic capacitive-coupling communication circuit.

FIG. 8 illustrates an embodiment of a system 800 comprising first and second chips IC1, IC2. The first chip IC1 has a first top surface S1 and the second chip IC2 has a second top surface S2, and the first and second chips IC1, IC2 are set in a face-to-face configuration, in such a way that the first and second top surfaces S1, S2 face one another. For instance, assuming that the first and second chips IC1, IC2 are formed by respective bodies of semiconductor material (not shown), the first and second top surfaces S1, S2 can be defined, respectively, by the bodies of semiconductor material of the first and second chips IC1, IC2. Alternatively, the first and second top surfaces S1, S2 can be defined by respective top regions (not shown) of the first and second integrated circuits IC1, IC2, arranged on the respective bodies of semiconductor material, and comprising, for example, metallizations and/or dielectric layers.

As shown in FIG. 8, the system 800 comprises a plurality of reference channels 8a-8n, distributed between the first and second chips IC1, IC2. As illustrated, the reference channels 8a-8n comprise: respective transmission calibration stages 24a-24n, formed in the first chip IC1; respective reception calibration stages 26a-26n, formed in the second chip IC2; and respective reference capacitors $C_{REFa}$-$C_{REFn}$ formed by respective transmission reference electrodes 28a-28n and by respective reception reference electrodes 30a-30n, which extend, respectively, on the first and second top surfaces S1, S2.

It is possible to obtain the reference capacitors $C_{REFa}$-$C_{REFn}$ in such a way that, when the first and second chips IC1, IC2 are aligned, they are the same as one another, and hence have one and the same capacitance, within tolerance levels. For example, it is possible to form and set the transmission reference electrodes 28a-28n and the reception reference electrodes 30a-30n in such a way that they have the same shapes, respectively. In addition, it is possible to obtain the transmission reference electrodes 28a-28n and the reception reference electrodes 30a-30n in such a way that, when the first and second chips IC1, IC2 are aligned, their respective mutual arrangements are the same. In this way, the reference capacitors $C_{REFa}$-$C_{REFn}$ may introduce the same attenuation when the chips are properly aligned (within tolerances). Other relationships between reference capacitors may be employed in some embodiments.

As illustrated the transmission calibration stages 24a-24n comprise respective first reference amplifiers 32a-32n, first reference circuits 34a-34n, first comparator stages 36a-36n, and first reference buffers 38a-38n. The first reference amplifiers 32a-32n may be of a variable-gain analog type, and have an input, an output, and a control terminal. The input of the respective the first reference amplifiers 32a-32n define respective first calibration nodes $N_{REFa}$-$N_{REFn}$ whilst the output of the first reference amplifiers 32a-32n define respective first first-feedback nodes $N_{1a}$-$N_{1n}$ and are coupled to the input of respective first reference buffers 38a-38n, the outputs of which are coupled to respective transmission reference electrodes 28a-28n. In addition, the output of the first reference amplifiers 32a-32n are coupled to respective first comparator stages 36a-36n. The first comparator stages 36a-36n each have an output and a first input and a second input, the output of the first reference amplifiers 32a-32n being coupled to the first input of the respective first comparator stage 36a-36n. The second input of the first comparator stages 36a-36n are coupled to the respective first reference circuits 34a-34n, whilst the output of the first comparator stages 36a-36n are coupled to the respective control terminals of the first reference amplifiers 32a-32n, in such a way that the respective first reference amplifiers 32a-32n and the first comparator stages 36a-36n define respective first feedback loops.

As illustrated, the reception calibration stages 26a-26n comprise respective second reference amplifiers 40a-40n, second reference circuits 42a-42n, and second comparator stages 44a-44n. In what follows it is assumed, for reasons of simplicity, that the respective second reference amplifiers 40a-40n are the same as one another, even though a person skilled in the art will be able to implement embodiments even in the case where respective second reference amplifiers are different. Possibly, also the first reference amplifiers 322-32n can be the same as the second reference amplifiers 40a-40n.

The second comparator stages 44a-44n may be the same as the first comparator stages 36a-36n, and hence each have an output and a first input and a second input. In addition, the second reference amplifiers 40a-40n may be of a variable-gain analog type, and each have an input, an output, and a control terminal. The respective inputs of the second reference amplifiers 40a-40n are coupled to the respective reception reference electrodes 30a-30n, whilst the outputs of the second reference amplifiers 40 define respective first second-feedback nodes $N_{2a}$-$N_{2n}$ and are coupled to respective first inputs of the respective second comparator stages 44a-44n. The second inputs of the second comparator stages 44a-44n are coupled to respective second reference circuits 42a-42n, whilst the outputs of the second comparator stages 44a-44n are coupled to the control terminals of the respective second reference amplifiers 40a-40n in such a way that the second reference amplifiers 40a-40n and the second comparator stages 44a-44n define respective second feedback loops.

The first and second reference circuits 34a-34n, 42a-42n supply respective first reference voltages and second reference voltages, each of a D.C. type. The first reference circuits 34a-34n and second reference circuits 42a-42n may be formed by respective bandgap voltage references, commonly known as bandgap circuits. Although as illustrated each transmission calibration stage 24a-24n has a respective reference circuit 34a-34n, in some embodiments one or more transmission calibration stages 24a-24n could share a reference circuit. For example, transmission calibration stage 24a and transmission calibration stage 24b could share a single reference circuit 34a, and reference circuit 34b could be omitted. Similarly, as illustrated each reception calibration stage 26a-26n has a respective reference circuit 42a-42n, in some embodiments one or more transmission calibration stages 26a-26n could share a reference circuit. For example, transmission calibration stage 26a and transmission calibration stage 26b could share a single reference circuit 42a, and reference circuit 42b could be omitted. Bandgap circuits are discussed in more detail above.

The system 800 also comprises: a communication channel 802 including a first transmitter stage 2, formed in the first chip IC1; a first receiver stage 4, formed in the second chip IC2; and at least one first communications channel 6, which comprises a first coupling capacitor $C_{C1}$ and connects the first transmitter stage 2 and the first receiver stage 4. The first coupling capacitor $C_{C1}$ is formed by a first transmission electrode 10 and by a first reception electrode 12, which extend, respectively, on the first and second top surfaces S1, S2. The first transmitter stage 2 comprises a transmitter circuit 14 and a first transmission buffer 16, which has an input coupled to the transmitter circuit 14, and an output coupled to the first transmission electrode 10.

The first receiver stage 4 comprises a first compensation amplifier 18 of a variable-gain analog type, a first reception buffer 20, and a receiver circuit 22. In particular, the first compensation amplifier 18 has, in addition to a control terminal described hereinafter, an input coupled to the first reception electrode 12 and an output coupled to the input of the first reception buffer 20. The output of the first reception buffer 20 is hence coupled to the receiver circuit 22.

Both the first transmission buffer 16 and the first reception buffer 20 are such as to be able to drive the loads present on the respective outputs, in the case in point the first transmission electrode 10 and the receiver circuit 22. Consequently, when the transmitter circuit 14 generates a first communication signal $V_{IN}$ of an analog type and of a known amplitude, it is brought back onto the first transmission electrode 10, with consequent generation, on the first reception electrode 12, of a corresponding first received signal $V_{OUT}$.

On account of the inevitable presence of parasitic capacitors connected to the first transmission electrode 10 and to the first reception electrode 12, even assuming that the first transmission buffer 16 is ideal, the amplitude of the first received signal $V_{OUT}$ is attenuated with respect to the amplitude of the first communication signal $V_{IN}$. In practice, the parasitic capacitors and the first coupling capacitor $C_{C1}$ form a capacitive divider that causes an attenuation of the first received signal $V_{OUT}$ with respect to the first communication signal $V_{IN}$. To compensate this attenuation either totally or in part, it is possible to act on the first compensation amplifier 18, by appropriately varying the gain thereof. For this purpose, the control terminal of the first compensation amplifier 18 is coupled to one or more of the reference channels 8a-8n, as described hereinafter. Although as illustrated, the control terminal of the first compensation amplifier 18 is coupled to only one of the reference channels, in some embodiments the control terminal of the first compensation amplifier 18 may be coupled to more than one of the reference channels. In some embodiments, additional transmitter 2 and receiver 4 stages may be employed, each of which may be coupled to one or more of the reference channels.

It is also possible to obtain one or more of the reference capacitors $C_{REF}$ and the first coupling capacitor $C_{C1}$ in such a way that, when the first and second chips IC1, IC2 are aligned, they are the same as one another, and hence have one and the same capacitance. In particular, it is possible to form and set one or more of the transmission reference electrodes 28a-28n and the reception reference electrodes 30a-30n in such a way that they have the same shapes, respectively, as the first transmission electrode 10 and the first reception electrode 12.

In addition, it is possible to obtain one or more of the transmission reference electrodes 28a-28n and the reception reference electrodes 30a-30n in such a way that, when the first and second chips IC1, IC2 are aligned, their mutual arrangement is the same as the mutual arrangement of the first transmission electrode 10 and of the first reception electrode 12. In this way, one or more of the reference capacitors $C_{REFa}$-$C_{REFn}$ and the first coupling capacitor $C_{C1}$ introduce one and the same attenuation. Such a relationship may be used, for example, as discussed above, to control a gain of the communication circuit 802, or to determine whether the first and second chips are aligned.

The first comparator stages 36a-36n may comprise, for example, embodiments of the comparator stage illustrated in FIG. 3. The second comparator stages 44a-44n may be similar to the first comparator stages 36a-36n, and supply second control signals $V_{ctrla}$-$V_{ctrln}$ on the control terminals of the second reference amplifiers 40a-40n. As illustrated, the control signal $V_{ctrln}$ of one of the reception calibration stages 26n is coupled to the first compensation amplifier 18.

Operatively, the behavior of an embodiment of the system 800 is now described. It is assumed that the calibration nodes $N_{REFa}$-$N_{REFn}$ receive a calibration signal $V_{cal}$ of a time-variable type, which can differ from the first communication signal $V_{IN}$. In some embodiments, different calibration signals may be applied to the calibration nodes $N_{REFa}$-$N_{REFn}$. Alternatively, it is in any case possible to connect first calibration nodes $N_{REFa}$-$N_{REFn}$ to the transmitter circuit 14 in such a way that the calibration signal $V_{cal}$ is the same as the first communication signal $V_{IN}$.

Present on the respective outputs of the first reference amplifiers 32a-32n, and hence present on the first first-feedback nodes $N_{1a}$-$N_{1n}$, is a first reference signal $V_{REFa}$-$V_{REFn}$, which is likewise present on the transmission reference electrodes 28a-28n. Given the capacitive coupling between the transmission reference electrodes 28a-28n and the reception reference electrodes 30a-30n, at input to the second reference amplifiers 40a-40n, coupling signals $V_{REF\_RXa}$-$V_{REF\_RXn}$ are set up. At output from the second reference amplifiers 40a-40n, and hence on the second-feedback nodes $N_{2a}$-$N_{2n}$, second reference signals $V_{REF2a}$-$V_{REF2n}$ are, instead, present.

Thanks to the first feedback loop, the first control signals $V_{ctrTXa}$-$V_{ctrTXn}$ control the gain of the first reference amplifiers 32a-32n in such a way that the first reference signals $V_{REF1a}$-$V_{REF1n}$ (time-variable) have amplitudes independent of the amplitude of the calibration signal $V_{cal}$ and directly proportional to the first reference voltages $V_{BGa}$-$V_{BGn}$ generated by the first reference circuits 34a-34n; in other words, the following respective relations apply: $V_{REFa-n} = k_{a-n} \cdot V_{BGa-n}$. In detail, in steady-state conditions, the first control signals $V_{ctrTXa}$-$V_{ctrTXn}$ assume constant values that depends upon the amplitude of the calibration signal $V_{cal}$ and upon the respective first reference voltage $V_{BGa}$-$V_{BGn}$.

Assuming that the first and second reference voltages $V_{BG1a-n}$, $V_{BG2a-n}$ are the same as one another, and that also the architectures of the first and second comparator stages 36a-36n, 44a-44n are the same as one another (and hence $k_{1a-n} = k_{2a-n} = k$), the second reference signals have the same amplitude and the same temporal evolution as the first reference signals, which, amongst other things, have the same temporal evolution as the calibration signal $V_{cal}$. In other words, the second control signals $V_{ctrRXa}$-$V_{ctrRXn}$ determine the gains of the second reference amplifiers 40a-40n in such a way as to compensate for the attenuation introduced by the capacitive divider formed by the respective reference capacitors $C_{REFa}$-$C_{REFn}$, irrespective of the alignment or misalignment of the first and second chips IC1, IC2. Thus, it is possible to determine whether the first and second chips IC1, IC2 are aligned by determining whether an expected relationship between the second control signals $V_{ctrRXa}$-$V_{ctrRXn}$ is satisfied. In the case where the calibration reference channels 8a-8n are identical (within tolerances), the second control signals $V_{ctrRXa}$-$V_{ctrRXn}$ would be expected to be the same in the case of proper alignment (again, within tolerances). Of course, other expected relationships may be employed in some embodiments, such as when one or more of the calibration reference channels are not identical. As the second control signals $V_{ctrRXa}$-$V_{ctrRXn}$ are direct current signals, comparing the signals to determine whether the expected relationship exists and thus whether the first and second chips IC1, IC2 are aligned is simplified. In the case of misalignment, the second control signals $V_{ctrRXa}$-$V_{ctrRXn}$ will have a relationship, different from the expected relationship, which depends in particular upon the characteristics (degree of a translation and of a possible rotation) of the misalignment, in a manner similar to that discussed above.

Figure 9:
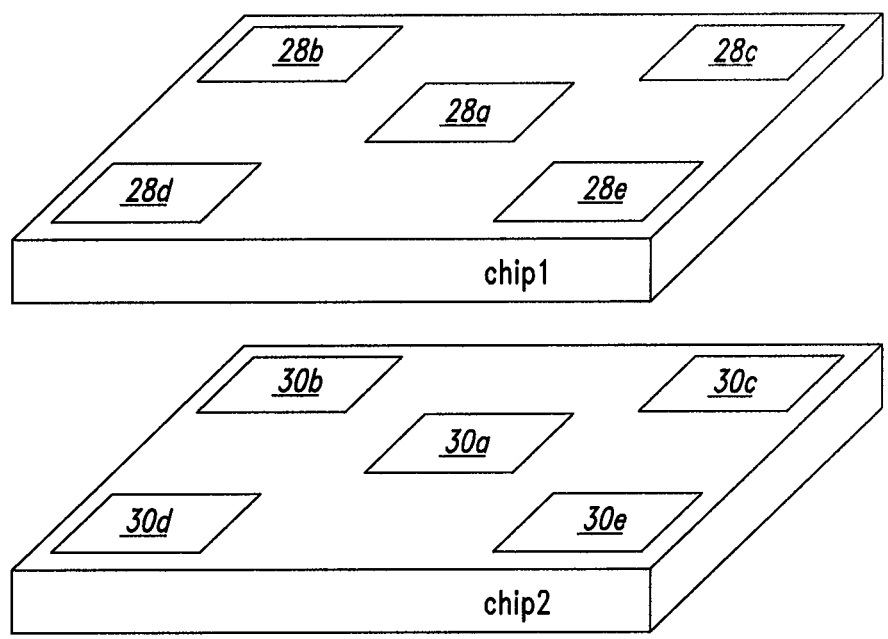
FIG. 9 is a schematic illustration of a perspective view of an embodiment of a first chip and of a second chip.

As illustrated by way of example in FIG. 9, one of a plurality of transmission reference electrodes 28a and one of a plurality of reception reference electrodes 30a can be set at the center, respectively, of the first and second top surfaces S1, S2 of the first and second chips. In addition, additional transmission reference electrodes 28b-28e and additional reception reference electrodes 30b-30e can be set so as to be centered, respectively, in corresponding vertices of a first imaginary rectangle and a second imaginary rectangle having respective centers coinciding with the centers of the transmission reference electrode 28a and of the reception reference electrode 30a. In addition, there may for example be present one or more communications channels (see communication channel 802 in FIG. 8). The plurality of transmission reference electrodes and reception reference electrodes may have various configurations, such as configurations similar to those of the various electrodes illustrated in FIG. 4.

Figure 10:
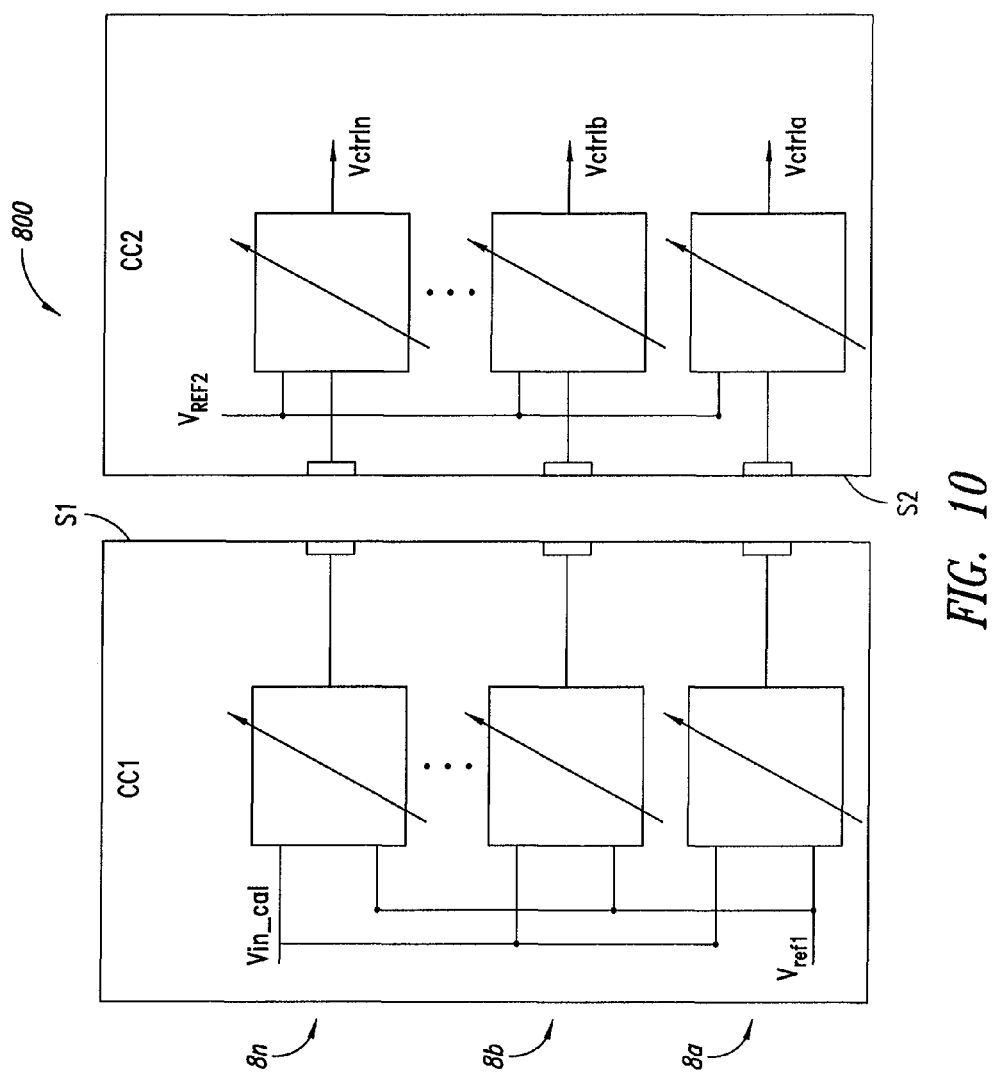
FIG. 10 is a functional block diagram of an embodiment of a chip assembly.

FIG. 10 is a functional block diagram illustrating an embodiment of a system 800 configured to test alignment of first and second chips CC1, CC2. The system comprises a plurality of calibration reference channels 8a-8n, such as the calibration references channels illustrated in FIG. 8. A first reference signal $V_{ref1}$ (for example, generated by a bandgap circuit), a second reference signal $V_{ref2}$ (for example, generated by a bandgap circuit), and a calibration signal of an analog type $V_{in\_cal}$, are applied to the calibration reference channels 8a-8n, and feedback control signals $V_{ctrla}$-$V_{ctrln}$ are output by the calibration reference channels 8a-8n. Two or more of the feedback control signals $V_{ctrla}$-$V_{ctrln}$, alone or together with other signals, such as Vref1, Vref2, Vin_cal, one or communication channel signals (see communication channel 802 of FIG. 8), etc., may be compared or otherwise analyzed to determine whether the chips CC1, CC2 are properly aligned, and if not, the manner in which the chips CC1, CC2 are not aligned.

Figure 11:
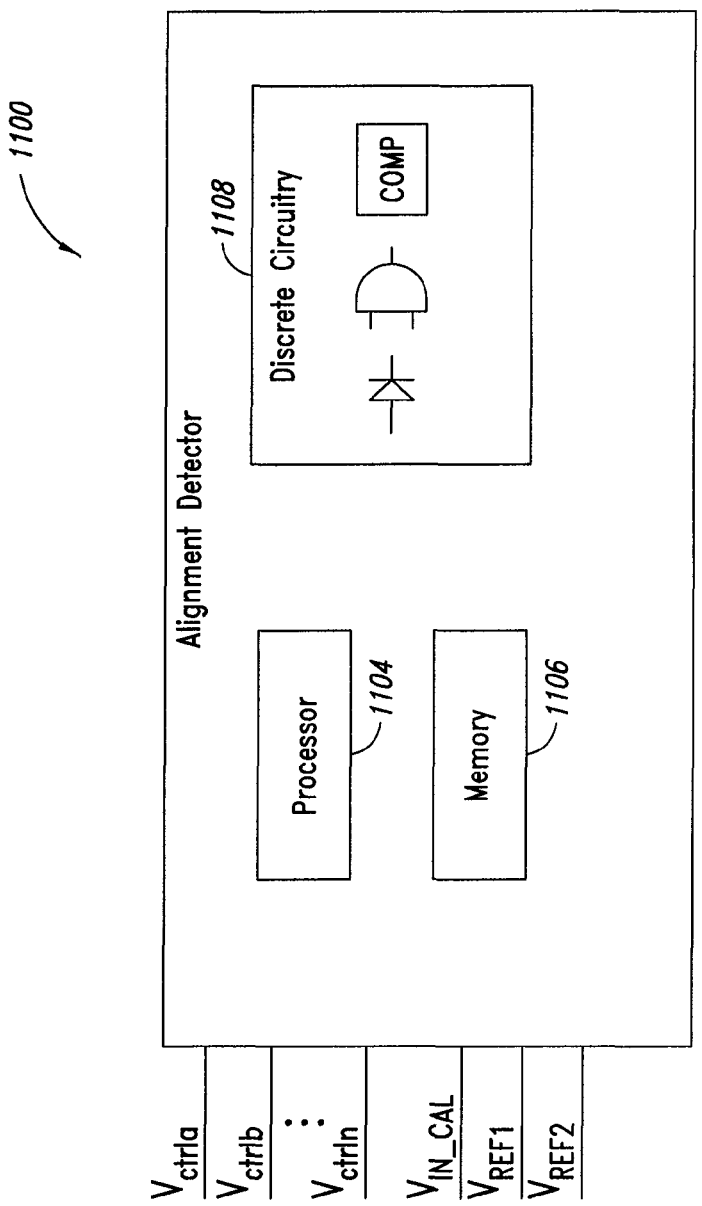
FIG. 11 is a functional block diagram of an embodiment of a system configured to determine whether a plurality of chips are aligned or misaligned.

FIG. 11 is a functional block diagram of an alignment detector 1100 that may be employed to determine whether a first integrated circuit (for example, IC1 of FIG. 2, IC1 of FIG. 8), and second integrated circuit (for example, IC2 of FIG. 2 and IC2 of FIG. 8) are aligned, and if not, the nature of any misalignment. In FIG. 11, similar reference numbers are used to denote elements that are similar to embodiments of the corresponding elements of FIGS. 2, 4, 8 and 10. The alignment detector is configured to determine whether the first integrated circuit and the second integrated circuit are properly aligned. For example, the alignment detector 1100 may be configured to determine whether the first and second integrated circuits are aligned based on the calibration reference channel control signals (as illustrated $V_{ctrla}$-$V_{ctrln}$), which may be direct current signals. In some embodiments, one or more other signals may be employed by the alignment detector 1100 to determine whether the first and second integrated circuits are aligned. For example, calibration signals (such as $V_{in\_cal}$, $V_{ref1}$, $V_{ref2}$), amplitudes of respective communication signals ($V_{Ina}$, $V_{INb}$, not shown in FIG. 11) and corresponding compensated signals ($V_{OUT\_Ea}$, $V_{OUT\_Eb}$, not shown in FIG. 11), etc., may be employed.

As illustrated, the alignment detector 1100 comprises one or more processors 1104, one or more memories 1106 and discrete circuitry 1108. As illustrated, the discrete circuitry comprises one or more rectifiers, one or more logic gates, and one or more comparators, but other or additional discrete circuitry may be employed. The alignment detector 1100 may be configured to use one or more of the processors, memory and discrete circuitry components to determine whether the first integrated circuit and the second integrated circuit are properly aligned. The alignment detector 1100 may be coupled to signals on the integrated circuits using probes, traces, and various other methods of electrically coupling components together, and various combinations thereof. In some embodiments, the alignment detector 1100 is separate from the first integrated circuit and the second integrated circuit (see FIG. 7). In some embodiments the aligment detector may be partially or wholly integrated into one or both of the integrated circuits.

The advantages that embodiments of the present disclosure may provide emerge clearly from the foregoing description. In particular, embodiments of the present disclosure do not require to know precisely the values of capacitance introduced by the coupling capacitors and by the reference capacitor, and hence enables detection of possible misalignments with a high degree of precision.

It is evident that modifications and variations may be made to the embodiments described and illustrated herein, without thereby departing from the scope of the present disclosure.

For instance, the first and second comparator stages 36, 44 can be different from the one described. By way of example, they can comprise double half-wave rectifiers. In addition, one or more of the buffers described may be absent.

Likewise, it is not necessary for the first and second chips IC1, IC2 to be set in face-to-face mode. Again, it is possible for the first and second reference voltages $V_{BG1}$, $V_{BG2}$ to be different, for example, because the first and second reference circuits 34, 42 are obtained in substrates of different materials.

It is possible to resort to signals of a differential type, instead of signals of a "single-ended" type.

Some embodiments may take the form of computer program products. For example, according to one embodiment there is provided a computer readable medium comprising a computer program adapted to perform one or more of the methods described above. The medium may be a physical storage medium such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the systems and/or modules may be implemented or provided in other manners, such as at least partially in firmware and/or hardware, including, but not limited to, one or more application-specific integrated circuits (ASICs), discrete circuitry, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology. In some embodiments, some of the modules or controllers separately described herein may be combined, split into further modules and/or split and recombined in various manners.

The various embodiments described above can be combined to provide further embodiments. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
communicatively coupling first and second integrated electronic devices together through a plurality of reference capacitors;
transmitting a plurality of transmission reference signals on transmission reference electrodes of the plurality of reference capacitors;
receiving coupling signals on reception reference electrodes of the plurality of reference capacitors;
amplifying said coupling signals, generating a plurality of reception reference signals;
generating a plurality of reception control signals as a function of the plurality of reception reference signals; and
detecting a possible misalignment between said first and second integrated electronic devices based on the plurality of reception control signals.

2. The method according to claim 1 wherein detecting a possible misalignment comprises comparing an expected relation between the plurality of reception control signals to an effective relationship between the plurality of reception control signals.

3. The method according to claim 1, further comprising the step of generating a reception reference voltage, wherein the generating a plurality of reception control signals comprises determining a difference between an amplitude of a respective reception reference signal and the reception reference voltage.

4. The method according to claim 3, further comprising:
receiving a calibration signal;
amplifying said calibration signal, generating the plurality of transmission reference signals;
generating a plurality of transmission control signals as a function of respective transmission reference signals; and controlling levels of amplification of the calibration signal as a function of said transmission control signal.

5. The method according to claim 4, further comprising: generating a transmission reference voltage, wherein the generating a plurality of transmission control signals comprises determining a difference between an amplitude of the respective transmission reference signals and said transmission reference voltage.

6. The method according to claim 5 wherein said transmission reference voltage and said reception reference voltage have a same voltage level.

7. The method according to claim 5 wherein said steps of generating a transmission reference voltage and generating a reception reference voltage comprise using voltage generators of a bandgap type.

8. The method according to claim 3 wherein determining the difference between an amplitude of the respective reception reference signal and the reception reference voltage comprises:
   generating a first current proportional to the amplitude of the respective reception reference signal;
   generating a second current proportional to the reception reference voltage; and
   integrating in time a current difference proportional to the difference of said first and second currents.

9. The method according to claim 1, further comprising:
   providing said plurality of transmission reference electrodes on the first integrated electronic device; and
   providing said plurality of reception reference electrodes on said second integrated electronic device.

10. The method according to claim 9 wherein said step of providing said plurality of transmission reference electrodes comprises forming said plurality of transmission reference electrodes of a first geometrical shape, and wherein said step of providing said plurality of reception reference electrodes comprises forming said plurality of reception reference electrodes of a second geometrical shape.

11. The method of claim 10 wherein the first geometric shape and the second geometric shape are a same shape.

12. The method according to claim 1, wherein said coupling step comprises providing at least one coupling capacitor of a communication channel having a communication transmission electrode and a communication reception electrode set on respective ones of the first and second integrated electronic devices.

13. The method according to claim 12, further comprising the steps of:
   transmitting on said communication transmission electrode a communication signal;
   receiving on said communication reception electrode a corresponding communication reception signal;
   amplifying said communication reception signal, generating a compensated signal; and
   controlling a level of amplification of said communication reception signal as a function of one of said plurality of reception control signals.

14. The method of claim 13 wherein detecting a possible misalignment is further based on an amplitude of said communication signal and an amplitude of said compensated signal.

15. The method of claim 4 wherein detecting a possible misalignment is further based on the calibration signal.

16. A system, comprising:
   a plurality of integrated circuits; and
   a plurality of reference calibration devices integrated into the plurality of integrated circuits, each of the reference calibration devices including:
      a reference transmission electrode of a reference capacitor on one of the plurality of integrated circuit;
      a transmitter configured to transmit time-variant communication signals communicatively coupled to the reference transmission electrode;
      a reception reference electrode of the reference capacitor on another of the plurality of integrated circuit;
      a reception reference variable-gain amplifier having a first input communicatively coupled to the reception reference electrode of the reference capacitor and configured to generate a calibration reference signal; and
      a reception reference gain control block coupled to an output of the reception reference variable-gain amplifier and configured to generate at least one gain control signal to control a gain of the reception reference variable-gain amplifier based on the calibration reference signal, wherein respective gain control signals of the plurality of reference calibration devices have one or more expected relationships when the plurality of integrated circuits are aligned.

17. The system of claim 16, further comprising:
   an alignment detector configured to receive the gain control signals of the plurality of reference calibration devices and to determine whether a relationship of the gain control signals of the plurality of reference calibration devices is consistent with alignment of the plurality of integrated circuits.

18. The system of claim 17 wherein the alignment detector is on one of the plurality of integrated circuits.

19. The system of claim 16 wherein the plurality of integrated circuits is two integrated circuits.

20. The system of claim 16 wherein the reception gain control block comprises:
   a bandgap block configured to generate a reception reference voltage; and
   a comparator configured to determine a difference between an amplitude of the output of the reception reference variable-gain amplifier and the reception reference voltage.

21. The system of claim 20 wherein the plurality of reference calibration devices each comprises:
   a transmission calibration variable-gain amplifier having a calibration signal input configured to receive a calibration signal, a control input configured to receive a gain control signal and an output communicatively coupled to the reference transmission electrode;
   a comparator block coupled between the output of the transmission calibration variable-gain amplifier and the control input of the transmission calibration variable gain amplifier to form a feed-back loop; and
   a bandgap block coupled to the comparator block and configured to provide a substantially constant reference voltage.

22. The system of claim 16 wherein the respective reference transmission electrodes each have a first geometrical shape, and the reception reference electrodes have a second geometrical shape.

23. The system of claim 16, further comprising a communication channel integrated into the plurality of integrated circuits, the communication channel having:
   a communication transmission electrode of a communication coupling capacitor on one of the plurality of integrated circuits;
   a transmitter configured to transmit time-variant communication signals communicatively coupled to the communication transmission electrode;

a communication reception electrode of the communication coupling capacitor on another of the plurality of integrated circuit devices; and a communication reception variable-gain amplifier having a first input communicatively coupled to the communication reception electrode of the communication coupling capacitor and configured to generate a communication compensation signal, and a gain control input coupled to one of the gain control signals generated by the plurality of reference calibration devices.

24. A device, comprising:

a first integrated circuit having a plurality of transmission reference electrodes of a corresponding plurality of calibration capacitors, the plurality of transmission reference electrodes configured to transmit respective time-variant communication signals; and a second integrated circuit configured to couple to the first integrated circuit and including:
 a plurality of reception reference electrodes of the plurality of calibration capacitors;
 a plurality of calibration amplifiers communicatively coupled to respective reception reference electrodes of the plurality of calibration capacitors and configured to generate a plurality of calibration reference signals; and
 a plurality of reception reference gain control blocks configured to generate gain control signals to control respective gains of the plurality of calibration amplifiers based on respective outputs of the calibration amplifiers, wherein the generated gain control signals have corresponding expected relationships when the first and second integrated circuits are aligned.

25. The device of claim 24 wherein:

the plurality of transmission reference electrodes include a center transmission reference electrode, and the other electrodes of the plurality of transmission reference electrodes surround the center transmission reference electrode, have a first shape and are each a first distance from the center transmission reference electrode; and the plurality of reception reference electrodes include a center reception reference electrode, and the other electrodes of the plurality of reception reference electrodes surround the center reception reference electrode, have a second shape and are each a second distance from the center reception reference electrode.

26. The device of claim 25 wherein the center transmission reference electrode and the center reception reference electrode have a third shape and, when the first and second integrated circuits are aligned, the center transmission reference electrode and the center reception reference electrode are superimposed, and the respective surrounding transmission reference electrodes and surrounding reception reference electrodes of the plurality of calibration capacitors are partially superimposed.

27. The device of claim 24, further comprising:

an alignment detector configured to determine whether the first and second integrated circuits are aligned based on the generated gain control signals.

28. A system, comprising:

a first integrated circuit, including:
 means for generating a plurality of time-variant reference transmission signals;
 means for transmitting the plurality of time-variant reference transmission signals;

a second integrated circuit configured to couple to the first integrated circuit and including:
 means for receiving the plurality of transmitted time-variant reference transmission signals;
 means for generating a plurality of reception reference signals from the received time-variant reference transmission signals; and
 means for generating a plurality of gain control signals to control the means for generating the plurality of reception reference signals; and means for determining whether the first and second integrated circuits are aligned based on the generated plurality of gain control signals.

29. The system of claim 28 wherein the means for determining is on the second integrated circuit.

30. A non-transitory computer-readable medium whose contents cause at least one electronic device to perform a method, the method comprising:

transmitting a plurality of transmission reference signals on transmission reference electrodes of a plurality of reference capacitors coupling first and second integrated circuits together;

receiving coupling signals on reception reference electrodes of the plurality of reference capacitors;

amplifying said coupling signals, generating a plurality of reception reference signals;

generating reception control signals as a function of the plurality of reception reference signals; and detecting a possible misalignment between the first and second integrated circuits based on a plurality of the reception control signals.

31. The non-transitory computer-readable medium of claim 30 wherein the method further comprises:

transmitting a first communication signal on a first transmission electrode of a first coupling capacitor;

receiving a first reception signal on a first reception electrode of said first coupling capacitor;

amplifying said first reception signal, generating a first compensated signal; and controlling a level of amplification of amplifying said first reception signal as a function of one of the reception control signals.

32. The non-transitory computer readable medium of claim 30 wherein the method further comprises: generating at least one reception reference voltage, and wherein generating the plurality of reception control signals comprises determining a difference between an amplitude of at least one of the reception reference signals and said at least one reception reference voltage.

33. The non-transitory computer readable medium of claim 32 wherein the method further comprises:

receiving a calibration signal;

amplifying said calibration signal, generating the transmission reference signals;

generating transmission control signals as a function of said transmission reference signals; and controlling one or more levels of amplification of the calibration signal as a function of said transmission control signals.

34. The non-transitory computer readable medium of claim 33 wherein the method further comprises:

generating a transmission reference voltage, wherein said step of generating transmission control signals comprises determining a difference between an amplitude of at least one of said transmission reference signals and said transmission reference voltage.

* * * * *